(12) United States Patent
Kim et al.

(10) Patent No.: US 11,735,701 B2
(45) Date of Patent: Aug. 22, 2023

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Soohyun Kim, Seoul (KR); Wonseok Choi, Seoul (KR); Sungmin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 121 days.

(21) Appl. No.: 17/153,592

(22) Filed: Jan. 20, 2021

(65) Prior Publication Data

US 2021/0265541 A1 Aug. 26, 2021

(30) Foreign Application Priority Data

Feb. 25, 2020 (KR) .......................... 10-2020-0023179

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/005* (2013.01); *H01L 33/38* (2013.01);
(Continued)

(58) Field of Classification Search
CPC ..... H01L 33/62; H01L 27/156; H01L 33/005; H01L 33/38; H01L 2933/0016;
(Continued)

(56) References Cited

U.S. PATENT DOCUMENTS 9,825,202 B2 11/2017 Schuele et al.
2018/0122298 A1* 5/2018 Lee ....................... H01L 27/124
(Continued)

FOREIGN PATENT DOCUMENTS

CN 108022936 A 5/2018
CN 108022940 A 5/2018
(Continued)

*Primary Examiner* — Victor A Mandala
(74) *Attorney, Agent, or Firm* — Birch, Stewart, Kolasch & Birch, LLP

(57) ABSTRACT

Discussed are a display device and a method of manufacturing the same, and more particularly, to a display device including a semiconductor light emitting device having a size of several μm to several tens of μm and a method of manufacturing the same. The present disclosure provides a display device, including a base portion, a plurality of transistors disposed on the base portion, a plurality of semiconductor light emitting devices disposed on the base portion, a plurality of wiring electrodes disposed on the base portion, and electrically connected to the plurality of transistors and the plurality of semiconductor light emitting devices, a partition wall disposed on the base portion, and formed to cover the plurality of transistors, and a connection electrode connecting some of the plurality of transistors and some of the plurality of wiring electrodes, wherein the connection electrode is configured to pass through the partition wall.

20 Claims, 22 Drawing Sheets

(51) Int. Cl.
*H01L 33/00* (2010.01)
*H01L 33/38* (2010.01)

(52) U.S. Cl.
CPC ............... *H01L 2933/0016* (2013.01); *H01L 2933/0066* (2013.01)

(58) Field of Classification Search
CPC ......... H01L 2933/0066; H01L 25/0753; H01L 33/0095; H01L 2224/95101; H01L 25/167; H01L 21/76895; H01L 25/105
See application file for complete search history.

(56) References Cited

U.S. PATENT DOCUMENTS

| | | | |
|---|---|---|---|
| 2018/0122836 A1* | 5/2018 | Kang | H01L 33/60 |
| 2018/0122837 A1* | 5/2018 | Kang | H01L 27/124 |
| 2019/0035817 A1* | 1/2019 | Park | H01L 29/41733 |
| 2019/0115513 A1* | 4/2019 | Im | H01L 33/20 |
| 2019/0164946 A1* | 5/2019 | Fu | H01L 24/32 |
| 2019/0206330 A1 | 7/2019 | Kim et al. | |
| 2019/0326477 A1 | 10/2019 | Kim et al. | |
| 2020/0020672 A1* | 1/2020 | Xi | H01L 27/1214 |
| 2020/0043400 A1* | 2/2020 | Chen | G09G 3/22 |
| 2020/0043976 A1* | 2/2020 | Kim | H01L 25/0753 |
| 2020/0118508 A1* | 4/2020 | Park | H01L 27/1251 |
| 2020/0212102 A1* | 7/2020 | Park | H01L 33/62 |
| 2020/0411492 A1* | 12/2020 | Ju | H01L 25/0753 |
| 2021/0225817 A1* | 7/2021 | Liao | H01L 25/0753 |

FOREIGN PATENT DOCUMENTS

| | | |
|---|---|---|
| CN | 109300931 A | 2/2019 |
| CN | 109994068 A | 7/2019 |
| EP | 3316301 A1 | 5/2018 |
| EP | 3316302 A1 | 5/2018 |
| KR | 10-2020-0014868 A | 2/2020 |
| WO | WO 2019/203405 A1 | 10/2019 |

* cited by examiner

DISPLAY DEVICE USING SEMICONDUCTOR LIGHT EMITTING DEVICE AND METHOD FOR MANUFACTURING THE SAME

CROSS-REFERENCE TO RELATED APPLICATIONS

Pursuant to 35 U.S.C. § 119(a), this application claims the benefit of an earlier filing date of and the right of priority to Korean Patent Application No. 10-2020-0023179, filed Feb. 25, 2020 in the Republic of Korea, the contents of which are hereby expressly incorporated by reference into the present application.

BACKGROUND

1. Technical Field

The present disclosure relates to a display device and a method of manufacturing the same, and more particularly, to a display device using a semiconductor light emitting device having a size of several μm to several tens of μm and a method of manufacturing the same.

2. Description of the Related Art

In recent years, liquid crystal displays (LCDs), organic light emitting diode displays (OLED), and micro LED displays have been competed to implement a large-area display in the field of display technology.

On the other hand, when semiconductor light emitting devices having a diameter or a cross sectional area of 100 microns or less (micro LED (μLED)) are used in a display, the display can provide a very high efficiency because it does not absorb light using a polarizing plate or the like. However, since a large-sized display requires millions of semiconductor light emitting devices, it has difficulty in transferring the devices compared to other technologies.

Technologies currently in development for transfer processes include pick and place, laser lift-off (LLO), self-assembly, or the like. Among them, the self-assembly method, which is a method in which the semiconductor light emitting device locates themselves in a fluid, is the most advantageous method for realizing a large-sized display device.

In recent years, U.S. Pat. No. 9,825,202 proposed a micro LED structure suitable for self-assembly, but there is not yet research on technologies for manufacturing a display through self-assembly of micro LEDs. Accordingly, the present disclosure proposes a new type of manufacturing method and apparatus in which micro LEDs can be self-assembled.

SUMMARY

An object of the present disclosure is to provide a new manufacturing process with high reliability in a large-screen display using micro-sized semiconductor light emitting devices.

Another object of the present disclosure is to provide a manufacturing process capable of improving transfer precision when self-assembling a semiconductor light emitting device with an assembly substrate.

Still another object of the present disclosure is to provide a structure and method capable of performing self-assembly with only a wiring electrode without having a separate assembly electrode for self-assembly.

In order to achieve the foregoing objectives, the present disclosure can provide a display device, a base portion, a plurality of transistors disposed on the base portion, a plurality of semiconductor light emitting devices disposed on the base portion, a plurality of wiring electrodes disposed on the base portion, and electrically connected to the plurality of transistors and the plurality of semiconductor light emitting devices, a partition wall disposed on the base portion, and formed to cover the plurality of transistors, and a connection electrode connecting some of the plurality of transistors and some of the plurality of wiring electrodes, wherein the connection electrode is configured to pass through the partition wall.

According to an embodiment, each of the some transistors and the some wiring electrodes can be disposed on one surface facing the base portion between both surfaces of the partition wall.

According to an embodiment, part of the connection electrode can be disposed on the other side between both surfaces of the partition wall.

According to an embodiment, the partition wall can include a plurality of via holes formed to pass through the partition wall, and part of the connection electrode can be disposed inside the via hole.

According to an embodiment, the via hole can include a first via hole formed to overlap with the some transistors, and a second via hole formed to overlap with the some wiring electrodes.

According to an embodiment, the connection electrode can include a first connection electrode disposed inside the first via hole, a second connection electrode disposed inside the second via hole, and a third connection electrode disposed on the other surface of the partition wall to electrically connect the first and second connection electrodes.

According to an embodiment, the partition wall can include a plurality of grooves formed to pass through the partition wall, and the plurality of semiconductor light emitting devices can be disposed inside the grooves.

According to an embodiment, the some wiring electrodes can include a protruding portion formed to protrude toward the groove.

According to an embodiment, the semiconductor light emitting device can be disposed to overlap with the protruding portion.

According to an embodiment, the display device can further include a dielectric layer formed between the some wiring electrodes and the semiconductor light emitting device to maintain an insulation state between the some wiring electrodes and the semiconductor light emitting device.

According to an embodiment, the connection electrode can be formed to pass through the partition wall and the dielectric layer.

According to an embodiment, another wiring electrode disposed in parallel to the some wiring electrodes can include a protruding portion formed to protrude toward the groove.

In addition, there can be provided a method of manufacturing a display device, and the method can include forming a plurality of transistors and a plurality of wiring electrodes on a base portion, forming a dielectric layer to cover the plurality of transistors and the plurality of wiring electrodes, forming a partition wall having a plurality of grooves on the dielectric layer, placing a semiconductor light emitting device on each of the plurality of grooves while a voltage is applied to some of the wiring electrodes, and forming a connection electrode that electrically connects some of the plurality of transistors and some of the plurality of wiring electrodes, wherein each of the some transistors and the some wiring electrodes is formed on one surface of the partition wall, and part of the connection electrode is formed on the other surface of the partition wall.

According to an embodiment, said forming the connection electrode can include forming a plurality of via holes overlapping with the some transistors and the some wiring electrodes on the partition wall, and forming a connection electrode inside the via hole and on the other surface of the partition wall.

According to an embodiment, the method can further include forming a planarizing layer that covers the semiconductor light emitting device and the partition wall subsequent to placing the semiconductor light emitting device on each of the plurality of grooves, wherein the via hole is formed to pass through the planarizing layer.

According to the present disclosure having the foregoing configuration, a large number of semiconductor light emitting devices can be assembled at one time in a display device in which individual pixels are formed with micro light emitting diodes.

As described above, according to the present disclosure, a large number of semiconductor light emitting devices can be pixelated on a wafer having a small size, and then transferred onto a large-area substrate. Through this, it can be possible to manufacture a large-area display device at a low cost.

Furthermore, according to the manufacturing method of the present disclosure, semiconductor light emitting devices can be simultaneously transferred to exact positions using a magnetic field and an electric field in a solution, thereby allowing a low cost, high efficiency, and high-speed transfer implementation.

In addition, since assembly by an electric field is carried out, selective assembly can be allowed through a selective electrical application without any additional device or process. Moreover, an assembly substrate can be placed on an upper side of a chamber, thereby facilitating loading and unloading of the substrate, and preventing non-specific binding of the semiconductor light emitting device.

Besides, according to the present disclosure, it may not be required to form an additional assembly electrode for self-assembly, thereby simplifying the structure of the display device, and reducing the manufacturing cost of the display device.

DETAILED DESCRIPTION OF THE EMBODIMENTS

Figure 1:
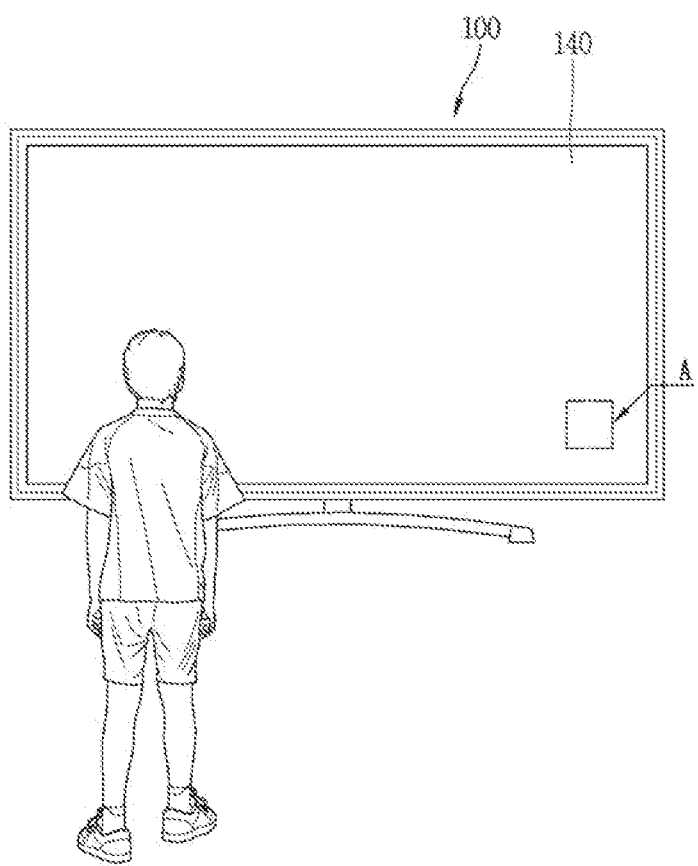
FIG. 1 is a conceptual view showing a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element can also be interposed therebetween.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein can be applicable to any displayable device even though it is a new product type which will be developed later.

Figure 2:
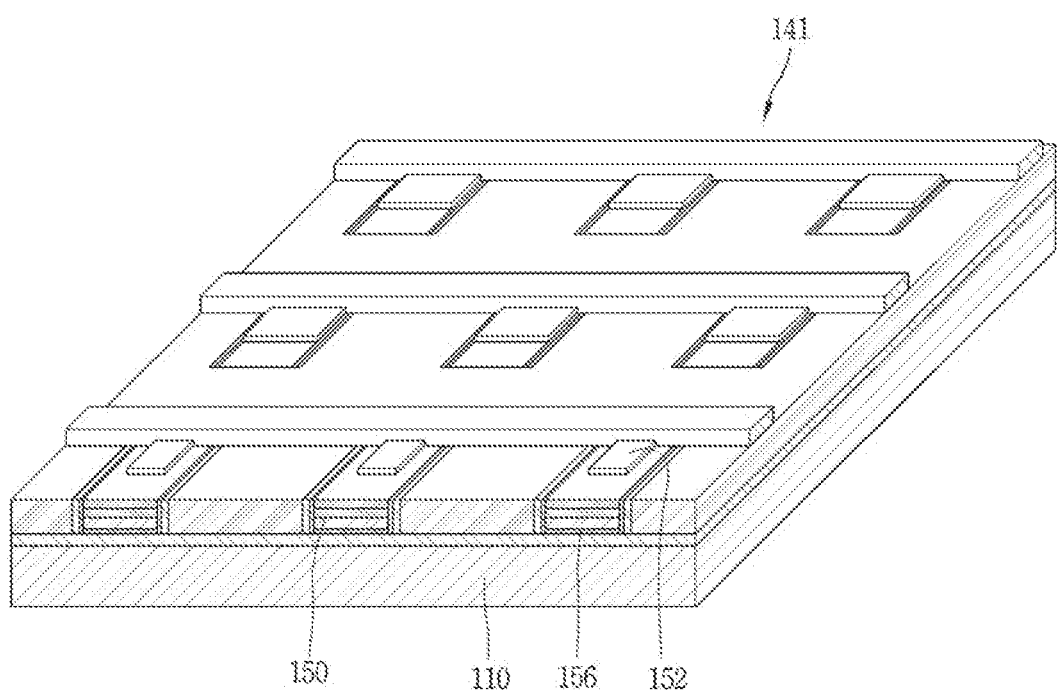
FIG. 2 is a partially enlarged view showing a portion "A" of the display device in FIG. 1.
Figure 3:
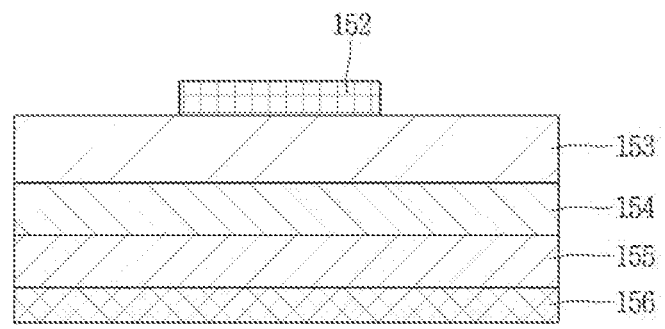
FIG. 3 is an enlarged view showing a semiconductor light emitting device in FIG. 2.
Figure 4:
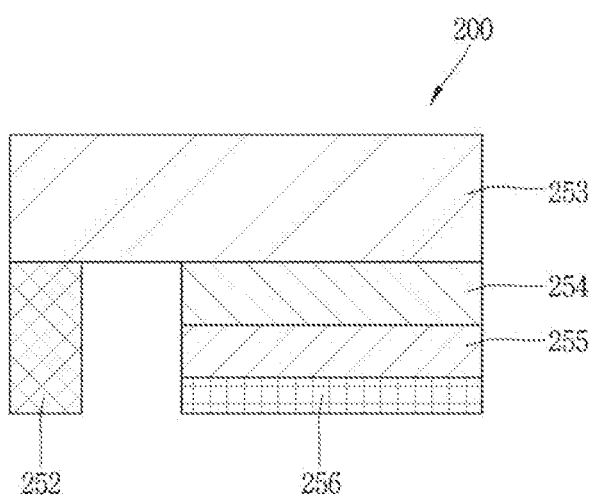
FIG. 4 is an enlarged view showing another embodiment of the semiconductor light emitting device in FIG. 2.

FIG. 1 is a conceptual view showing a display device using a semiconductor light emitting device according to an embodiment of the present disclosure, and FIG. 2 is a partially enlarged view showing a portion "A" of the display device in FIG. 1, and FIG. 3 is an enlarged view showing a semiconductor light emitting device in FIG. 2, and FIG. 4 is an enlarged view showing another embodiment of the semiconductor light emitting device in FIG. 2.

According to the illustration, information processed in the controller of the display device 100 can be displayed on a display module 140. A case 101 in the form of a closed loop surrounding an edge of the display module can form a bezel of the display device.

The display module 140 can include a panel 141 on which an image is displayed, and the panel 141 can include micro-sized semiconductor light emitting devices 150 and a wiring substrate 110 on which the semiconductor light emitting devices 150 are mounted.

Wiring lines can be formed on the wiring substrate 110, and connected to an n-type electrode 152 and a p-type electrode 156 of the semiconductor light emitting device 150. Through this, the semiconductor light emitting device 150 can be provided on the wiring substrate 110 as a self-emitting individual pixel.

An image displayed on the panel 141 is visual information, and implemented by independently controlling the light emission of a sub-pixel arranged in a matrix form through the wiring lines.

According to the present disclosure, a micro LED (Light Emitting Diode) is illustrated as one type of the semiconductor light emitting device 150 that converts current into light. The micro LED can be a light emitting diode formed with a small size of 100 microns or less. The semiconductor light emitting device 150 can be provided in blue, red, and green light emitting regions, respectively, to implement a sub-pixel by a combination of the light emitting regions. In other words, the sub-pixel denotes a minimum unit for implementing a single color, and at least three micro LEDs can be provided in the sub-pixel.

More specifically, referring to FIG. 3, the semiconductor light emitting device 150 can be a vertical structure.

For example, the semiconductor light emitting devices 150 can be implemented with a high-power light emitting device that emits various lights including blue in which gallium nitride (GaN) is mostly used, and indium (In) and or aluminum (Al) are added thereto.

The vertical semiconductor light emitting device can include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom can be electrically connected to a p-electrode of the wiring substrate, and the n-type electrode 152 located at the top can be electrically connected to an n-electrode at an upper side of the semiconductor light emitting device. The electrodes can be disposed in the upward/downward direction in the vertical semiconductor light emitting device 150, thereby providing a great advantage capable of reducing the chip size.

For another example, referring to FIG. 4, the semiconductor light emitting device can be a flip chip type semiconductor light emitting device.

For such an example, the semiconductor light emitting device 250 can include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 can be electrically connected to the p-electrode and the n-electrode of the wiring substrate at the bottom of the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. The green semiconductor light emitting device and the blue semiconductor light emitting device can be mostly formed of gallium nitride (GaN), and indium (In) and/or aluminum (Al) can be added thereto to implement a high-power light emitting device that emits green or blue light. For such an example, the semiconductor light emitting device can be a gallium nitride thin-film formed in various layers such as n-Gan, p-Gan, AlGaN, and InGa, and specifically, the p-type semiconductor layer can be p-type GaN, and the n-type semiconductor layer can be N-type GaN. However, in case of the red semiconductor light emitting device, the p-type semiconductor layer can be p-type GaAs and the n-type semiconductor layer can be n-type GaAs.

In addition, a p-electrode side in the p-type semiconductor layer can be p-type GaN doped with Mg, and an n-electrode side in the n-type semiconductor layer can be n-type GaN doped with Si. In this case, the above-described semiconductor light emitting devices can be semiconductor light emitting devices without an active layer.

On the other hand, referring to FIGS. 1 through 4, since the light emitting diode is very small, the display panel can be arranged with self-emitting sub-pixels arranged at fine pitch, thereby implementing a high-quality display device.

In a display device using the semiconductor light emitting device of the present disclosure described above, a semiconductor light emitting device grown on a wafer and formed through mesa and isolation is used as an individual pixel. In this case, the micro-sized semiconductor light emitting device 150 must be transferred to a wafer at a predetermined position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new manufacturing method of a display device capable of solving the foregoing problems and a manufacturing device using the same.

For this purpose, first, a new manufacturing method of the display device will be described. FIGS. 5A through 5E are conceptual views for explaining a new process of manufacturing the foregoing semiconductor light emitting device.

In this specification, a display device using a passive matrix (PM) semiconductor light emitting device is illustrated. However, an example described below can also be applicable to an active matrix (AM) type semiconductor light emitting device. In addition, a method of self-assembling a horizontal semiconductor light emitting device is illustrated, but it is also applicable to a method of self-assembling a vertical semiconductor light emitting device.

First, according to a manufacturing method, a first conductive semiconductor layer 153, an active layer 154, and a second conductive semiconductor layer 155 are respectively grown on a growth substrate 159.

Figure 5A:
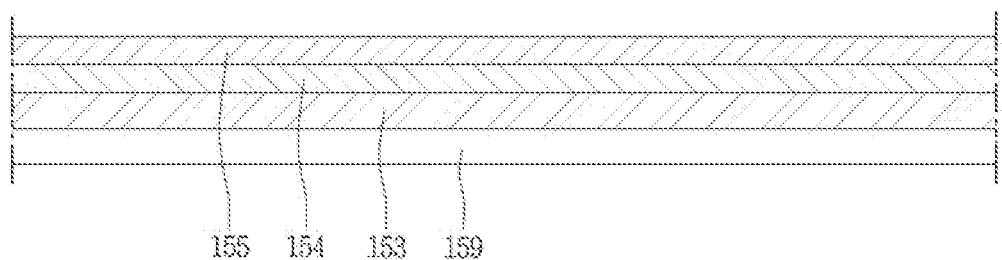
FIGS. 5A through 5E are conceptual views for explaining a new process of manufacturing the foregoing semiconductor light emitting device.

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 can be a p-type semiconductor layer, and the second conductive semiconductor layer 155 can be an n-type semiconductor layer. However, the present disclosure is not limited thereto, and the first conductive type can be n-type and the second conductive type can be p-type.

In addition, the present embodiment illustrates a case where the active layer is present, but it is also possible to adopt a structure in which the active layer is not present as described above. For such an example, the p-type semiconductor layer can be p-type GaN doped with Mg, and an n-electrode side in the n-type semiconductor layer can be n-type GaN doped with Si.

The growth substrate 159 (wafer) can be formed of any one of materials having light transmission properties, for example, sapphire ($Al_2O_3$), GaN, ZnO, and AlO, but is not limited thereto. Furthermore, the growth substrate 159 can be formed of a carrier wafer, which is a material suitable for semiconductor material growth. The growth substrate 1200 can be formed of a material having an excellent thermal conductivity, and for example, a SiC substrate having a higher thermal conductivity than a sapphire ($Al_2O_3$) substrate or a SiC substrate including at least one of Si, GaAs, GaP, InP and Ga2O3 can be used.

Figure 5B:
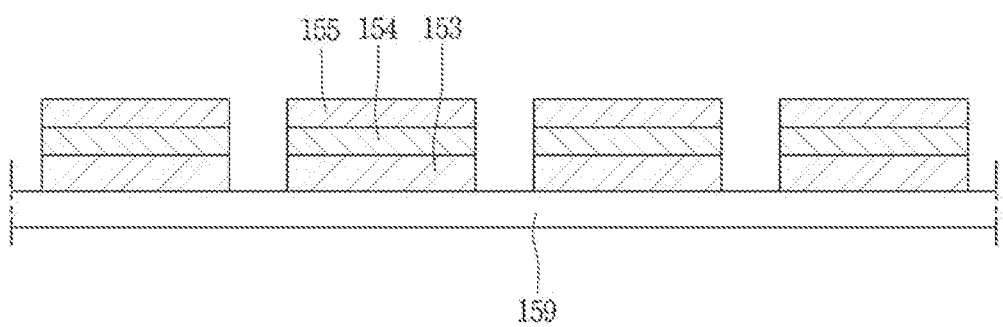

Next, at least part of the first conductive semiconductor layer 153, the active layer 154, and the second conductive semiconductor layer 155 is removed to form a plurality of semiconductor light emitting devices (FIG. 5B).

More specifically, isolation is performed to allow a plurality of light emitting devices form a light emitting device array. In other words, the first conductive semiconductor layer 153, the active layer 154, and the second conductive semiconductor layer 155 are etched in a vertical direction to form a plurality of semiconductor light emitting devices.

If it is a case of forming the horizontal semiconductor light emitting device, then the active layer 154 and the second conductive semiconductor layer 155 can be partially removed in a vertical direction to perform a mesa process in which the first conductive semiconductor layer 153 is exposed to the outside, and then isolation in which the first conductive semiconductor layer is etched to form a plurality of semiconductor light emitting device arrays.

Figure 5C:
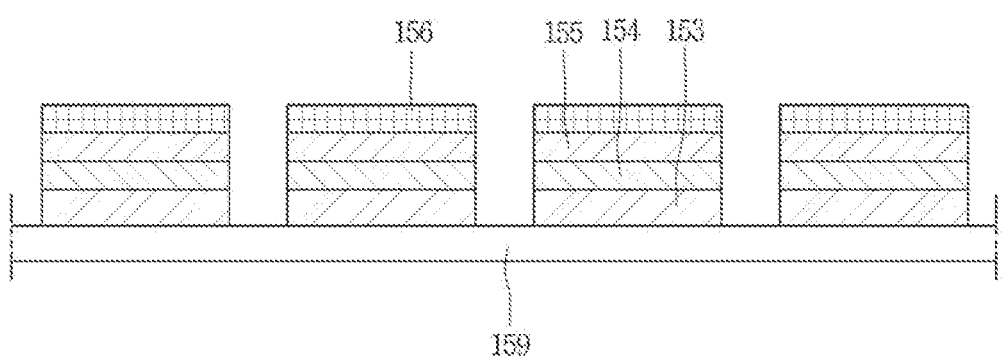

Next, a second conductive electrode 156 (or a p-type electrode) is respectively formed on one surface of the second conductive semiconductor layer 155 (FIG. 5C). The second conductive electrode 156 can be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 can also be an n-type electrode.

Figure 5D:
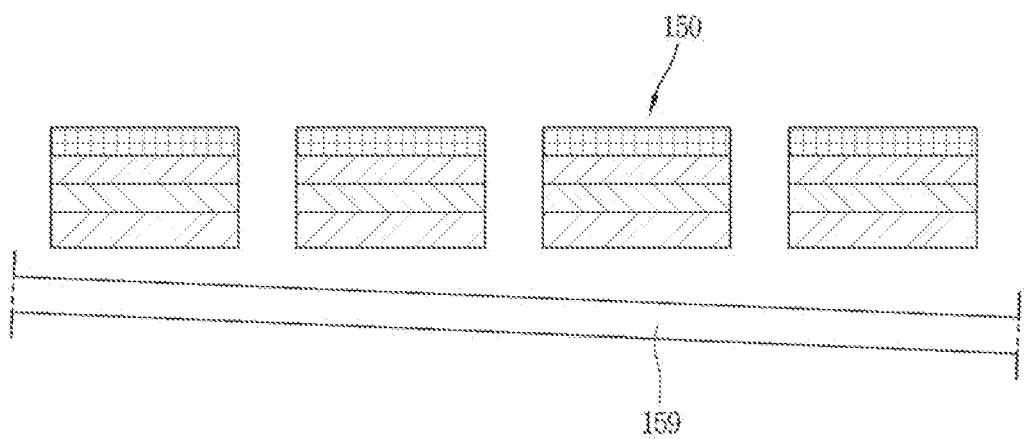

Then, the growth substrate 159 is removed to provide a plurality of semiconductor light emitting devices. For example, the growth substrate 159 can be removed using a laser lift-off (LLO) or chemical lift-off (CLO) method (FIG. 5D).

Figure 5E:
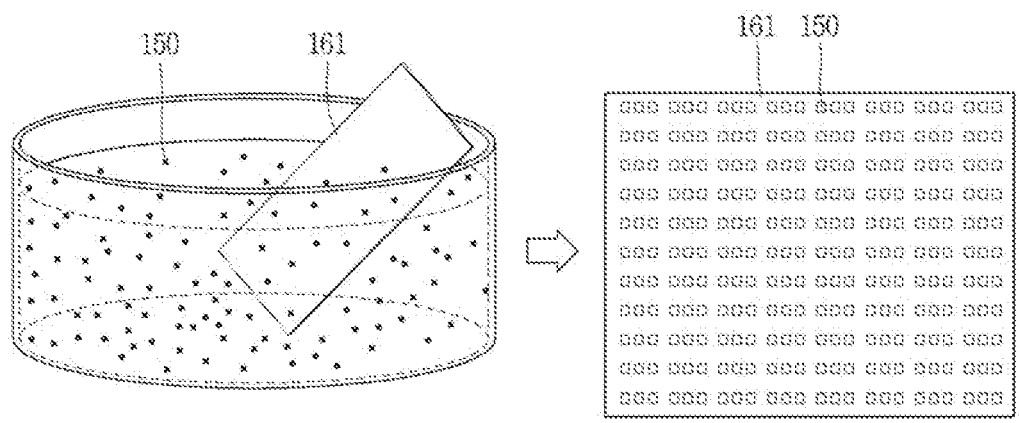

Then, the process of mounting the semiconductor light emitting devices 150 on the substrate in a chamber filled with a fluid is carried out (FIG. 5E).

For example, the semiconductor light emitting devices 150 and the substrate are placed in a chamber filled with a fluid, and the semiconductor light emitting devices are assembled to the substrate 161 by themselves using flow, gravity, surface tension, or the like. In this case, the substrate can be an assembly substrate 161.

For another example, the wiring substrate can also be placed in the fluid chamber instead of the assembly substrate 161 such that the semiconductor light emitting elements 150 are directly seated on the wiring substrate. In this case, the substrate can be a wiring substrate. However, for convenience of description, in the present disclosure, it is illustrated that the substrate is provided as an assembly substrate 161 and the semiconductor light emitting elements 1050 are seated thereon.

Cells into which the semiconductor light emitting devices 150 are fitted can be provided on the assembly substrate 161 so that the semiconductor light emitting elements 150 are easily seated on the assembly substrate 161. Specifically, cells on which the semiconductor light emitting devices 150 are seated are formed on the assembly substrate 161 at a position where the semiconductor light emitting devices 150 are aligned with the wiring electrode. The semiconductor light emitting devices 150 are assembled into the cells while moving in the fluid.

When the plurality of semiconductor light emitting devices are arrayed on the assembly substrate 161, and then the semiconductor light emitting devices on the assembly substrate 161 are transferred to the wiring substrate, it can enable large-area transfer. Therefore, the assembly substrate 161 can be referred to as a temporary substrate.

Meanwhile, the self-assembly method described above must increase transfer yield when applied to the manufacture of a large-screen display. The present disclosure proposes a method and apparatus for minimizing the influence of gravity or friction and preventing non-specific binding in order to increase the transfer yield.

In this case, in a display device according to the present disclosure, a magnetic body is disposed on the semiconductor light emitting device to move the semiconductor light emitting device using a magnetic force, and place the semiconductor light emitting device at preset position using an electric field in the movement process. Hereinafter, such a transfer method and device will be described in more detail with reference to the accompanying drawings.

Figure 6:
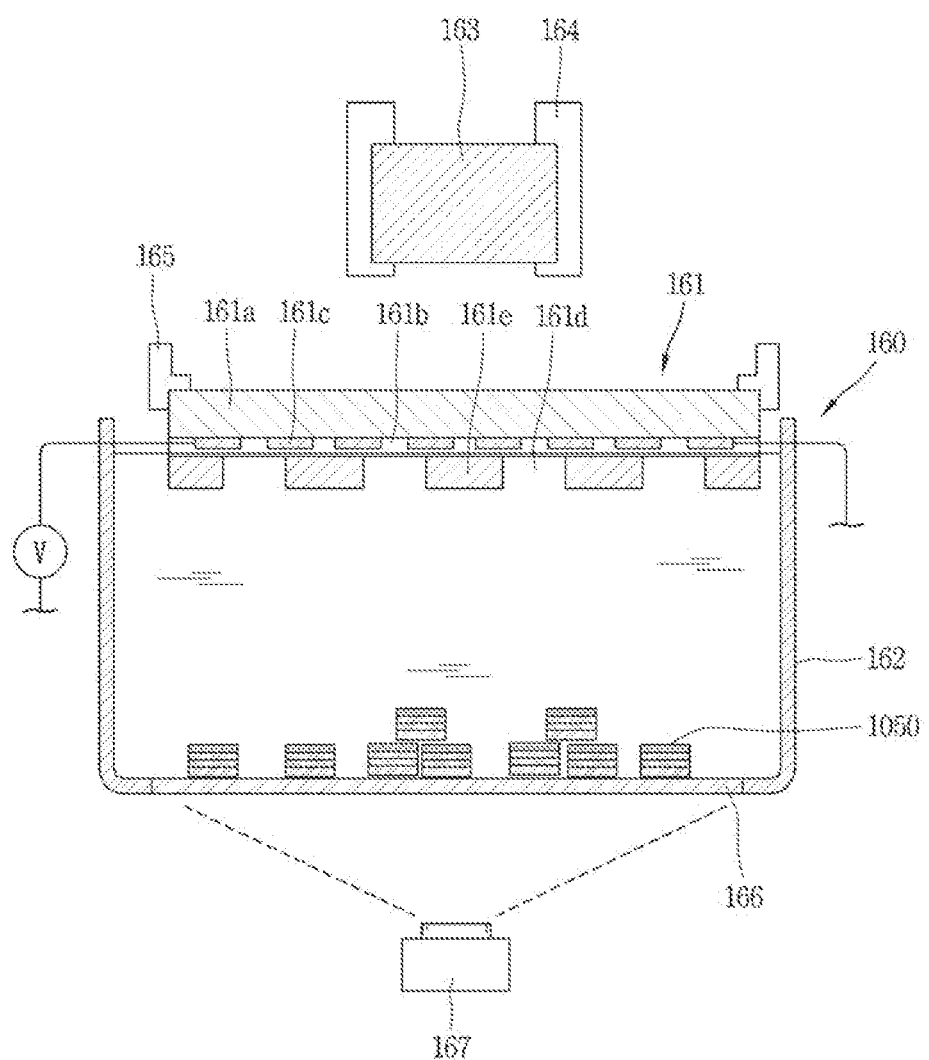
FIG. 6 is a conceptual view showing an example of a self-assembly device of semiconductor light emitting devices according to the present disclosure.
Figure 7:
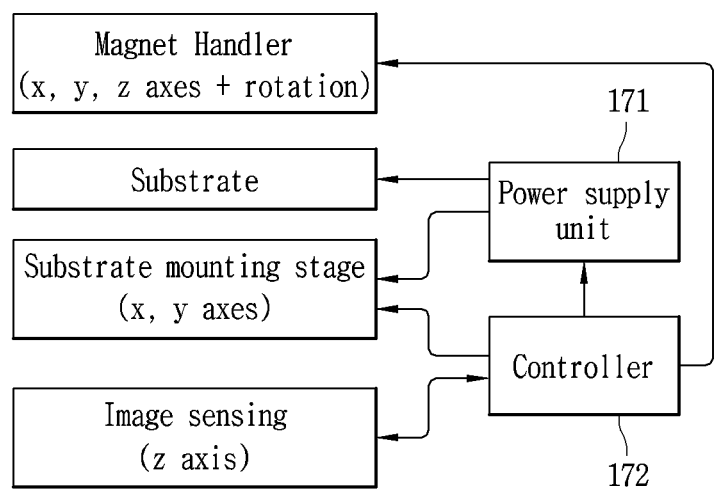
FIG. 7 is a block diagram showing the self-assembly device in FIG. 6.

FIG. 6 is a conceptual view showing an example of a self-assembly device of semiconductor light emitting devices according to the present disclosure, and FIG. 7 is a block diagram showing the self-assembly device in FIG. 6. FIGS. 8A through 8E are conceptual views showing a process of self-assembling semiconductor light emitting devices using the self-assembly device in FIG. 6, and FIG. 9 is a conceptual view for explaining the semiconductor light emitting device in FIGS. 8A through 8E.

According to the illustration of FIGS. 6 and 7, a self-assembly device 160 of the present disclosure can include a fluid chamber 162, a magnet 163, and a location controller 164.

The fluid chamber 162 has a space for accommodating a plurality of semiconductor light emitting devices. The space can be filled with a fluid, and the fluid can include water or the like as an assembly solution. Accordingly, the fluid chamber 162 can be a water tank, and can be configured with an open type. However, the present disclosure is not limited thereto, and the fluid chamber 162 can be a closed type in which the space is formed with a closed space.

The substrate 161 can be disposed on the fluid chamber 162 such that an assembly surface on which the semiconductor light emitting devices 150 are assembled faces downward. For example, the substrate 161 can be transferred to an assembly position by a transfer unit, and the transfer unit can include a stage 165 on which the substrate is mounted. The stage 165 is positioned by the controller, and the substrate 161 can be transferred to the assembly position through the stage 165.

At this time, the assembly surface of the substrate 161 faces the bottom of the fluid chamber 150 at the assembly position. According to the illustration, the assembly surface of the substrate 161 is disposed so as to be immersed in a fluid in the fluid chamber 162. Therefore, the semiconductor light emitting devices 150 are moved to the assembly surface in the fluid.

The substrate 161, which is an assembly substrate on which an electric field can be formed, can include a base portion 161a, a dielectric layer 161b and a plurality of electrodes 161c.

The base portion 161a can be made of an insulating material, and the plurality of electrodes 161c can be a thin or a thick film bi-planar electrode patterned on one side of the base portion 161a. The electrode 161c can be formed of, for example, a laminate of Ti/Cu/Ti, an Ag paste, ITO, and the like.

The dielectric layer 161b is made of an inorganic material such as SiO2, SiNx, SiON, Al2O3, TiO2, HfO2, or the like. Alternatively, the dielectric layer 161b can be composed of a single layer or multiple layers as an organic insulator. A thickness of the dielectric layer 161b can be several tens of nanometers to several micrometers.

Furthermore, the substrate 161 according to the present disclosure includes a plurality of cells 161d partitioned by partition walls. The cells 161d can be sequentially arranged along one direction, and made of a polymer material. In addition, the partition wall 161e constituting the cells 161d is configured to be shared with neighboring cells 161d. The partition walls 161e are protruded from the base portion 161a, and the cells 161d can be sequentially arranged along the one direction by the partition walls 161e. More specifically, the cells 161d are sequentially arranged in row and column directions, and can have a matrix structure.

As shown in the drawing, an inside of the cells 161d has a groove for accommodating the semiconductor light emitting device 150, and the groove can be a space defined by the partition walls 161e. The shape of the groove can be the same as or similar to that of the semiconductor light emitting device. For example, when the semiconductor light emitting device is in a rectangular shape, the groove can be a rectangular shape. In addition, when the semiconductor light emitting device is circular, the grooves formed in the cells can be formed in a circular shape. Moreover, each of the cells is configured to accommodate a single semiconductor light emitting device. In other words, a single semiconductor light emitting device is accommodated in a single cell.

Meanwhile, the plurality of electrodes 161c include a plurality of electrode lines disposed at the bottom of each of the cells 161d, and the plurality of electrode lines can be configured to extend to neighboring cells.

The plurality of electrodes 161c are disposed below the cells 161d and applied with different polarities to generate an electric field in the cells 161d. In order to form the electric field, the dielectric layer can form the bottom of the cells 161d while the dielectric layer covers the plurality of electrodes 161c. In such a structure, when different polarities are applied to a pair of electrodes 161c from a lower side of each cell 161d, an electric field can be formed, and the semiconductor light emitting device can be inserted into the cells 161d by the electric field.

At the assembly position, the electrodes of the substrate 161 are electrically connected to the power supply unit 171. The power supply unit 171 applies power to the plurality of electrodes to generate the electric field.

According to the illustration, the self-assembly device can include a magnet 163 for applying a magnetic force to the semiconductor light emitting devices. The magnet 163 is spaced apart from the fluid chamber 162 to apply a magnetic force to the semiconductor light emitting devices 150. The magnet 163 can be disposed to face an opposite side of the assembly surface of the substrate 161, and the location of the magnet is controlled by the location controller 164 connected to the magnet 163.

The semiconductor light emitting device 1050 can have a magnetic body so as to move in the fluid by the magnetic field of the magnet 163.

Referring to FIG. 9, the semiconductor light emitting device of the display device having a magnetic body can include a first conductive electrode 1052 and a second conductive electrode 1056, a first conductive semiconductor layer 1053 disposed with the first conductive electrode 1052, a second conductive semiconductor layer 1055 configured to overlap with the first conductive semiconductor layer 1052, and disposed with the second conductive electrode 1056, and an active layer 1054 disposed between the first and second conductive semiconductor layers 1053, 1055.

Here, the first conductive type and the second conductive type can be composed of p-type and n-type, and vice versa. In addition, as described above, it can be a semiconductor light emitting device without having the active layer.

Meanwhile, in the present disclosure, the first conductive electrode 1052 can be generated after the semiconductor light emitting device is assembled to the wiring board by the self-assembly of the semiconductor light emitting device. In addition, in the present disclosure, the second conductive electrode 1056 can include the magnetic body. The magnetic body can refer to a metal having magnetism. The magnetic body can be Ni, SmCo or the like, and for another example, a material corresponding to at least one of Gd-based, La-based, and Mn-based materials.

The magnetic body can be provided in the second conductive electrode 1056 in the form of particles. Furthermore, alternatively, for a conductive electrode including a magnetic body, a single layer of the conductive electrode can be made of a magnetic body. For such an example, as illustrated in FIG. 9, the second conductive electrode 1056 of the semiconductor light emitting device 1050 can include a first layer 1056a and a second layer 1056b. Here, the first layer 1056a can be made to include a magnetic material, and the second layer 1056b can include a metal material other than the magnetic material.

As illustrated, in this example, the first layer 1056*a* including a magnetic body can be disposed to be in contact with the second conductive semiconductor layer 1055. In this case, the first layer 1056*a* is disposed between the second layer 1056*b* and the second conductive semiconductor layer 1055. The second layer 1056*b* can be a contact metal connected to the second electrode of the wiring substrate. However, the present disclosure is not necessarily limited thereto, and the magnetic body can be disposed on one surface of the first conductive semiconductor layer.

Referring again to FIGS. 6 and 7, more specifically, the self-assembly device can include a magnet handler that can be automatically or manually moved in the x, y, and z axes on the top of the fluid chamber or include a motor capable of rotating the magnet 163. The magnet handler and the motor can constitute the location controller 164. Through this, the magnet 163 rotates in a horizontal direction, a clockwise direction, or a counterclockwise direction with respect to the substrate 161.

On the other hand, a light transmitting bottom plate 166 can be formed in the fluid chamber 162, and the semiconductor light emitting devices can be disposed between the bottom plate 166 and the substrate 161. An image sensor 167 can be positioned to view the bottom plate 166 so as to monitor an inside of the fluid chamber 162 through the bottom plate 166. The image sensor 167 is controlled by the controller 172, and can include an inverted type lens, a CCD, and the like to observe the assembly surface of the substrate 161.

The self-assembling apparatus described above is configured to use a combination of a magnetic field and an electric field, and using those fields, the semiconductor light emitting devices can be placed at preset positions of the substrate by an electric field in the process of being moved by a location change of the magnet. Hereinafter, an assembly process using the self-assembly device described above will be described in more detail.

First, a plurality of semiconductor light emitting devices 1050 having magnetic bodies are formed through the process described with reference to FIGS. 5A through 5C. In this case, a magnetic body can be deposited on the semiconductor light emitting device in the process of forming the second conductive electrode in FIG. 5C.

Figure 8A:
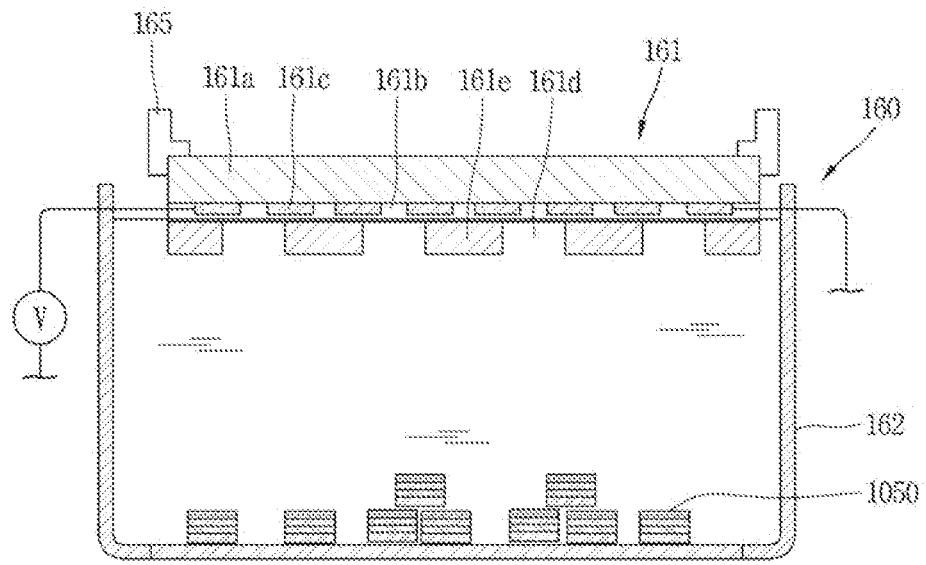
FIGS. 8A through 8E are conceptual views showing a process of self-assembling semiconductor light emitting devices using the self-assembly device in FIG. 6.
Figure 9:
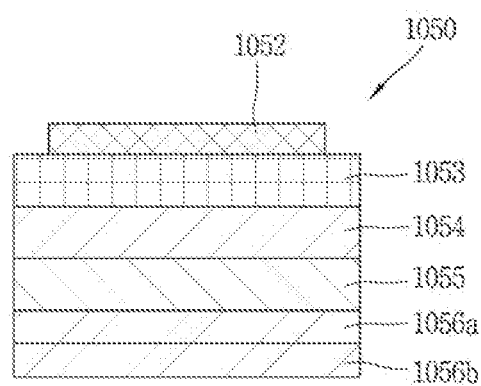
FIG. 9 is a conceptual view for explaining the semiconductor light emitting device in FIGS. 8A through 8E.

Next, the substrate 161 is transferred to the assembly position, and the semiconductor light emitting devices 1050 are put into the fluid chamber 162 (FIG. 8A).

As described above, the assembly position of the substrate 161 is a position at which the assembly surface on which the semiconductor light emitting devices 1050 of the substrate 161 are assembled is disposed in a downward direction in the fluid chamber 162.

In this case, some of the semiconductor light emitting devices 1050 can sink to the bottom of the fluid chamber 162 and some can float in the fluid. The light transmitting bottom plate 166 can be provided in the fluid chamber 162, and some of the semiconductor light-emitting devices 1050 can sink to the bottom plate 166.

Figure 8B:
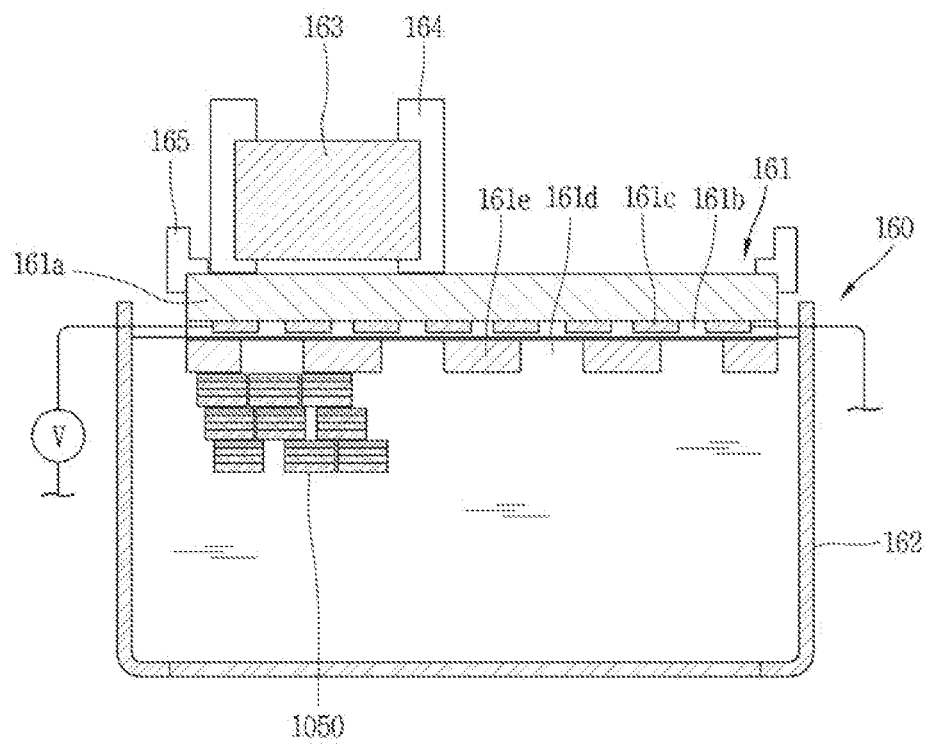

Next, a magnetic force is applied to the semiconductor light emitting devices 1050 so that the semiconductor light emitting devices 1050 float in the fluid chamber 162 in a vertical direction (FIG. 8B).

When the magnet 163 of the self-assembly device moves from its original position to an opposite side of the assembly surface of the substrate 161, the semiconductor light emitting devices 1050 float in the fluid toward the substrate 161. The original position can be a position away from the fluid chamber 162. For another example, the magnet 163 can be composed of an electromagnet. In this case, electricity is supplied to the electromagnet to generate an initial magnetic force.

Meanwhile, in this example, a separation distance between the assembly surface of the substrate 161 and the semiconductor light emitting devices 1050 can be controlled by adjusting the magnitude of the magnetic force. For example, the separation distance is controlled using the weight, buoyancy, and magnetic force of the semiconductor light emitting devices 1050. The separation distance can be several millimeters to tens of micrometers from the outermost edge of the substrate.

Figure 8C:
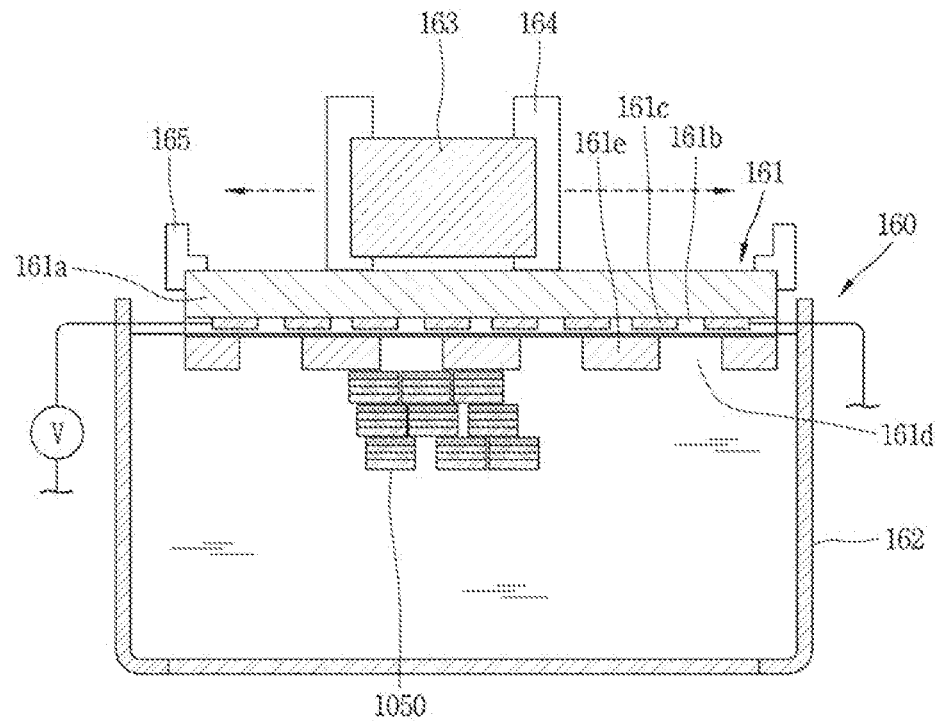

Next, a magnetic force is applied to the semiconductor light emitting devices 1050 so that the semiconductor light emitting devices 1050 move in one direction in the fluid chamber 162. For example, the magnet 163 moves in a horizontal direction, a clockwise direction or a counterclockwise direction with respect to the substrate (FIG. 8C). In this case, the semiconductor light emitting devices 1050 move in a direction parallel to the substrate 161 at a position spaced apart from the substrate 161 by the magnetic force.

Next, the process of applying an electric field to guide the semiconductor light emitting devices 1050 to preset positions of the substrate 161 so as to allow the semiconductor light emitting devices 1050 to be placed at the preset positions during the movement of the semiconductor light emitting devices 250 is carried out (FIG. 8C). For example, the semiconductor light emitting devices 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to carry out assembly only at preset positions. In other words, the semiconductor light emitting devices 1050 are assembled to the assembly position of the substrate 161 using a selectively generated electric field. For this purpose, the substrate 161 can include cells in which the semiconductor light emitting devices 1050 are inserted.

Then, the unloading process of the substrate 161 is carried out, and the assembly process is completed. When the substrate 161 is an assembly substrate, a post-process of transferring the aligned semiconductor light emitting devices to a wiring substrate as described above to implement a display device can be carried out.

Figure 8D:
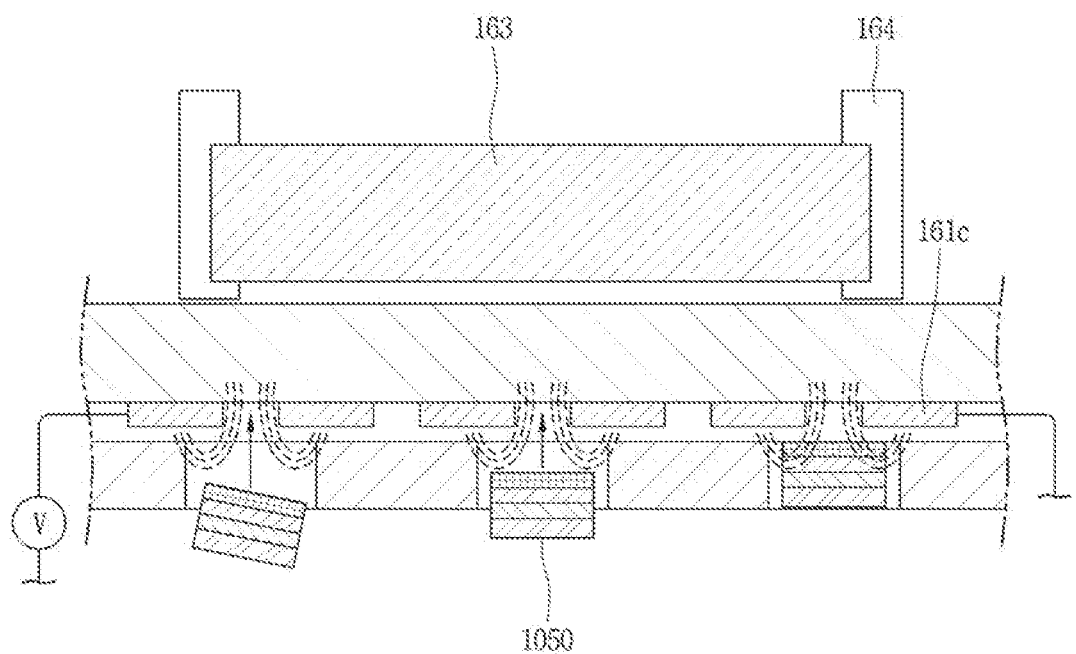

On the other hand, the semiconductor light emitting devices 1050 can be guided to the preset positions, then the magnet 163 can move in a direction away from the substrate 161 such that the semiconductor light emitting devices 1050 remaining in the fluid chambers 162 fall to the bottom of the fluid chambers 162, (FIG. 8D). For another example, if power supply is stopped when the magnet 163 is an electromagnet, then the semiconductor light emitting devices 1050 remaining in the fluid chamber 162 fall to the bottom of the fluid chamber 162.

Then, when the semiconductor light emitting devices 1050 on the bottom of the fluid chamber 162 are collected, the collected semiconductor light emitting devices 1050 can be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

As described above, according to the present disclosure having the foregoing configuration, a large number of semiconductor light emitting devices can be assembled at one time in a display device in which individual pixels are formed with semiconductor light emitting devices.

As described above, according to the present disclosure, a large number of semiconductor light emitting devices can be pixelated on a wafer having a small size, and then transferred onto a large-area substrate. Through this, it can be possible to manufacture a large-area display device at a low cost.

Meanwhile, the foregoing self-assembly method can be used for the manufacturing of an active matrix (AM) type display device. In this case, the foregoing self-assembly can be performed through a substrate having a plurality of transistors. Prior to describing a display device according to the present disclosure, self-assembly using a substrate including a plurality of transistors will be described.

Figure 10:
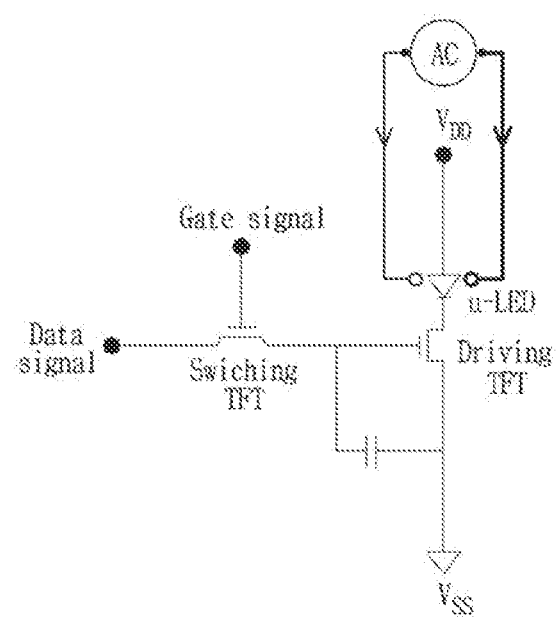
FIG. 10 is a circuit diagram of a display device having a plurality of transistors.
Figure 11:
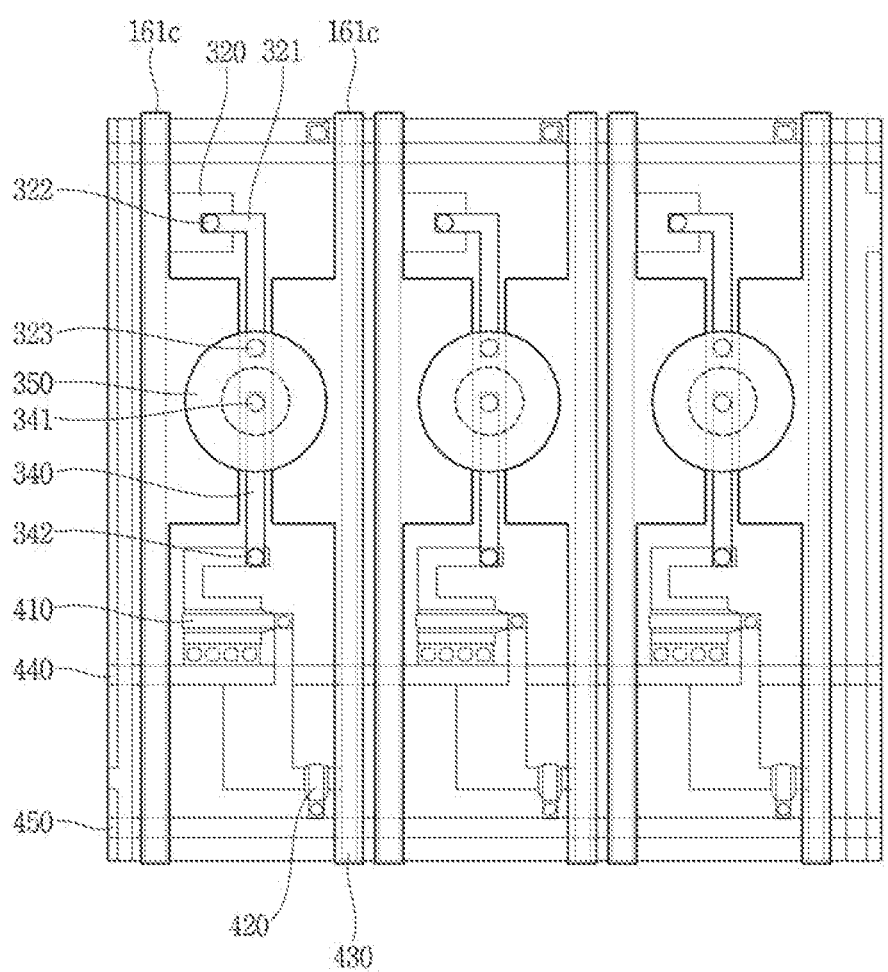
FIG. 11 is a plan view of a display device having a plurality of transistors.

FIG. 10 is a circuit diagram of a display device having a plurality of transistors, and FIG. 11 is a plan view of a display device having a plurality of transistors.

Referring to FIG. 10, in order to control the operation of a single semiconductor light emitting device (u-LED), two transistors are provided, which are thin film transistors. In the present specification, a case where the transistor is a thin film transistor (TFT) is described as an example, but the present disclosure is not limited thereto, and two transistors are not necessarily provided to control the operation of a single semiconductor light emitting device.

Meanwhile, either one of two conductive electrodes provided in the semiconductor light emitting device (u-LED) is electrically connected to VDD, and the other one is electrically connected to a driving TFT. On the other hand, any one of gate, source and drain electrodes provided a driving TFT is electrically connected to the semiconductor light emitting device (u-LED), and another one is electrically connected to VSS, and the remaining one is electrically connected to a switching TFT.

Any one of gate, source and drain electrodes provided in a switching TFT is electrically connected to a driving TFT, and another one is electrically connected to a gate signal application portion, and the remaining one is electrically connected to a data signal application portion.

Meanwhile, a capacitor is connected between the switching TFT and the driving TFT. Specifically, a first pole of the capacitor is electrically connected between the switching TFT and the driving TFT, and the second pole is electrically connected to the VSS.

Here, VDD and VSS denotes voltage sources to which a predetermined voltage is applied. Different voltages are applied to the VDD and VSS, respectively. A voltage applied by each of the gate signal application portion and the data signal application portion varies with time. As a result, the operation of the semiconductor light emitting device is controlled by the gate signal application portion and the data signal application portion.

On the other hand, when the above-described substrate is used for self-assembly, the substrate includes an assembly electrode. The assembly electrode is not electrically connected to the electrodes described above.

For convenience of description, all plan views described below are illustrated by projecting all electrodes disposed on a display device. Although it is illustrated in the drawing that a plurality of electrodes overlap with each other, it does not mean that the electrodes are electrically connected. An additional structure can be disposed between the electrodes overlapping with each other to insulate the electrodes overlapping with each other. The positional relationship and electrical connection relationship between the electrodes overlapping with each other will be separately described based on a base portion provided at the bottom of the substrate. Specifically, in the present specification, upper and lower sides are defined based on the base portion. For example, when a vertical distance between the first component and the base portion is smaller than that between the second component and the base portion, it is described that the first component is disposed below the second component.

Referring to FIG. 11, a driving TFT (hereinafter, first TFT, 410) and a switching TFT (hereinafter, second TFT, 420) are disposed on the base portion of the substrate. The TFTs can be disposed on the same plane as some of the electrodes which will be described later, and can be disposed on a different plane from some of the remaining electrodes. An insulating layer can be disposed between the TFT and some electrodes. The detailed description of the insulating layer formed between the TFT and the electrodes will be omitted.

In addition, an electrode that applies a voltage applied from a VDD voltage source (hereinafter, VDD electrode, 320), an electrode that applies a data signal (hereinafter, VData, 430), an electrode that applies a voltage applied from a VSS voltage source (hereinafter, VSS electrode, 440), and an electrode that applies a gate signal (hereinafter, VGate, 450) are disposed on the base portion provided on the substrate. The four electrodes are not in contact with each other. For example, the VDD electrode 320 and the VData electrode 430 can be disposed side by side on the same plane, and the VSS electrode 440) and the VGate electrode 450 can be disposed on a different plane from the plane disposed with the VDD electrode 320 and the VData electrode 430. An insulating layer can be formed between the VDD electrode 320 and the VData electrode 430, and the VSS electrode 440 and the VGate electrode 450. The detailed description of the insulating layer formed between the electrodes will be omitted.

Meanwhile, an assembly electrode is disposed above the TFTs and the electrodes. The assembly electrodes, the TFTs and other electrodes must not be electrically connected. In order to electrically insulate the assembly electrodes and other components, an insulating layer can be formed between the assembly electrodes and other components.

Figure 8E:
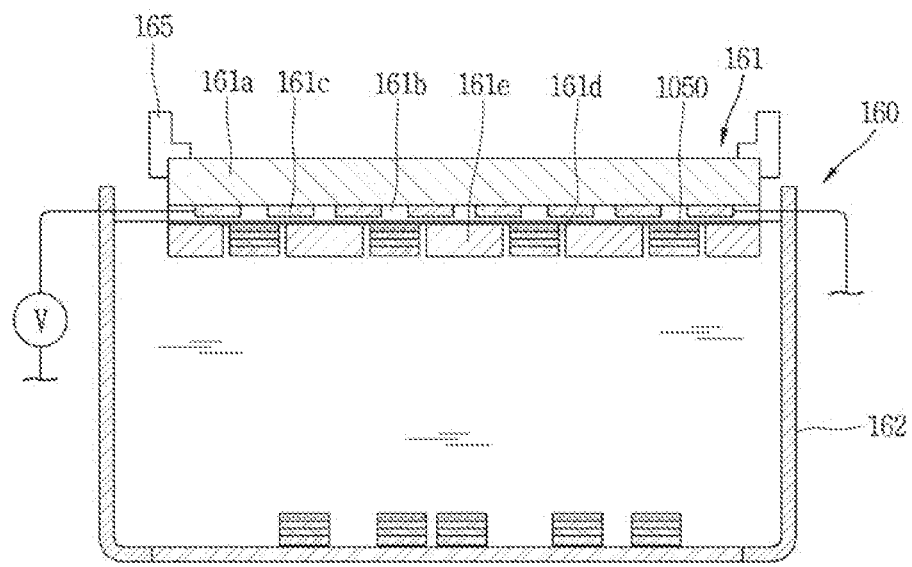

The self-assembly described in FIGS. 8A and 8E can be performed in a state where the assembly electrodes 161c are disposed on the TFTs, the VDD electrode 320, the VData electrode 430, the VSS electrode 440, and the VGate electrode 450. Accordingly, the semiconductor light emitting device 350 can be seated at a preset position. A planarizing layer is formed to cover the semiconductor light emitting device and the substrate while the semiconductor light emitting device 350 is seated at a preset position, and then a wiring process for applying a voltage to the semiconductor light emitting device 350 is carried out. When the planarizing layer is made of the same material as the partition walls described with reference to FIGS. 8A through 8E, the planarizing layer and the partition walls may not be distinguished with the naked eye. In the present specification, the planarizing layer and the partition wall are not separately distinguished.

In the wiring process, connection electrodes 321, 322, 323 are formed to electrically connect the conductive electrode provided in the semiconductor light emitting device to the VDD electrode 320, and other connection electrodes 340, 341, 342 are connected to electrically connect other conductive electrodes provided in the semiconductor light emitting device to the first TFT 410. Here, some of the connection electrodes 322, 323, 341, and 342 are formed inside via holes formed in the planarizing layer. Furthermore, some of the remaining connection electrodes 321, 340 are disposed above the planarizing layer. In other words, some of the remaining connection electrodes 321, 340, the assembly electrode 161c, the VDD electrode 320, the VData electrode 430, the VSS electrode 440, and the VGate electrode 450 are arranged above and below each other with a planarizing layer therebetween. In the present specification, the VDD electrode 320, the VData electrode 430, the VSS electrode 440, the VGate electrode 450, and the connection electrode are referred to as wiring electrodes, and are used as expressions distinct from the assembly electrodes.

Meanwhile, the via hole is formed not only passing through the planarizing layer, but also passing through the insulating layer formed on the electrodes. A subject through which the via hole passes can vary depending on a contact subject of the connection electrode.

Meanwhile, in case of the foregoing structure, an additional assembly electrode is required for self-assembly. For this reason, in order to transfer the semiconductor light emitting device directly onto the substrate formed with TFTs, a process of forming an additional assembly electrode is required. When self-assembly can be performed without forming an additional assembly electrode, it can be possible to shorten process time and reduce process cost. The present disclosure provides a structure and method capable of performing self-assembly using only the wiring electrode without using the foregoing assembly electrode.

Prior to describing the present disclosure, the reason why it is difficult to perform self-assembly using a wiring electrode will be described.

Figure 12:
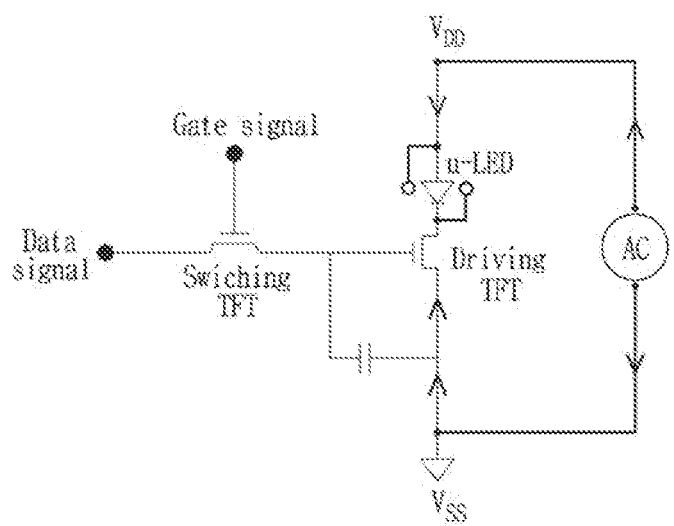
FIG. 12 is a circuit diagram capable of performing self-assembly using a wiring electrode.
Figure 13:
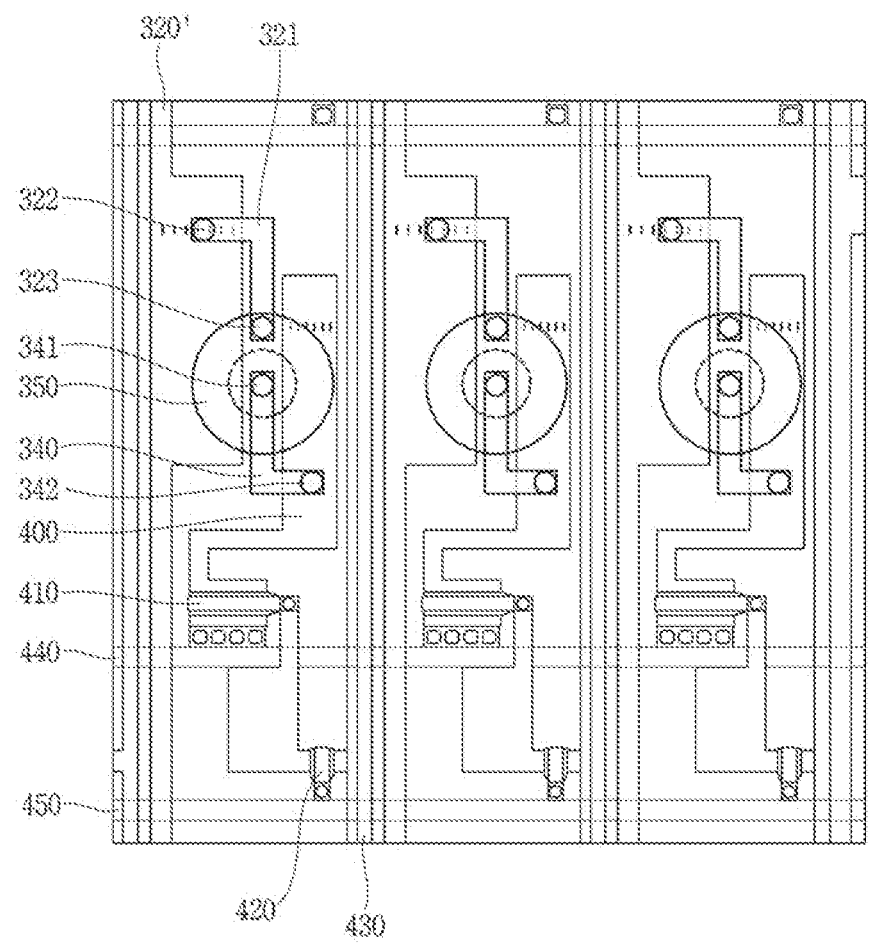
FIG. 13 is a plan view of a display device according to the circuit diagram described in FIG. 12.
Figure 14:
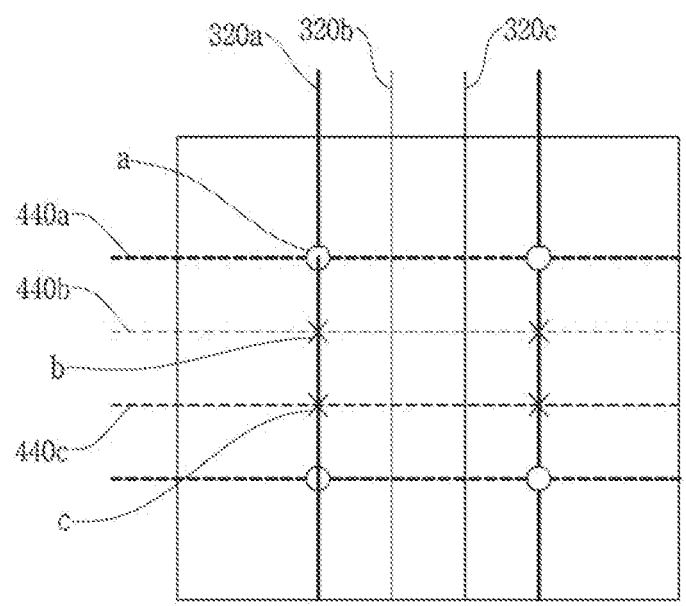
FIG. 14 is a conceptual view illustrating only a VDD electrode and a VSS electrode in the plan view described in FIG. 13.

FIG. 12 is a circuit diagram capable of performing self-assembly using a wiring electrode, and FIG. 13 is a plan view of a display device according to the circuit diagram described in FIG. 12, and FIG. 14 is a conceptual view illustrating only a VDD electrode and a VSS electrode in the plan view described in FIG. 13.

Referring to FIG. 12, a method of applying a voltage through a VDD electrode and a VSS electrode during self-assembly can be used. Specifically, an AC voltage applied during self-assembly is applied through the VDD and VSS electrodes. At this time, the voltage applied through the VSS electrode is applied to a source electrode of a first TFT, and accordingly, the voltage is also applied to a drain electrode of the first TFT. Meanwhile, no component is connected to the VDD electrode prior to self-assembly.

As shown in FIG. 13, an AC voltage is applied to the VDD electrode 320' and the drain electrode 400 of the first TFT 410 during self-assembly. The VDD electrode 320' and the drain electrode 400 of the first TFT 410 disposed adjacent to a region where the semiconductor light emitting device must be seated can be formed to be wider than the electrodes formed in the other region. Accordingly, a distance between the VDD electrode 320' and the drain electrode 400 provided in the first TFT 410 is reduced to strongly generate an electric field in the relevant region.

During self-assembly, the semiconductor light emitting device is seated between the VDD electrode 320' and the drain electrode 400 provided in the first TFT 410. Then, as described in FIG. 11, the planarizing layer is formed, and then the semiconductor light emitting device is electrically connected to the VDD electrode 320' and the first TFT 410 through the connection electrodes 321, 322, 323, 340, 341, 342.

In case of the self-assembly method described with reference to FIGS. 12 and 13, as a strong voltage is applied to the first TFT 410 during self-assembly, there can occur a problem that the first TFT 410 is damaged. Accordingly, the magnitude of the AC voltage that can be applied during self-assembly is limited to a voltage at which the first TFT 410 is not damaged. For this reason, the intensity of an electric field formed between the VDD voltage 320' and the drain electrode 400 provided in the first TFT 410 cannot be increased above a predetermined level.

On the other hand, when self-assembly is performed by applying an AC voltage to the VDD electrode and the VSS electrode as described in FIGS. 12 and 13, the self-assembled region is limited. Specifically, referring to FIG. 14, when a voltage is applied to any one 440a of three VDD electrodes 320a, 320b, 320b and three VSS electrodes 440a, 440b, 440c while the three VDD electrodes 320a, 320b, 320b and the three VSS electrodes 440a, 440b, 440c are disposed, a region where the semiconductor light emitting device is seated is limited to region "a". The semiconductor light emitting device is not seated in region "b" and region "c". For this reason, it can be difficult to align the semiconductor light emitting devices on a single line by the foregoing method.

When assembling semiconductor light emitting devices having different colors, one type of semiconductor light emitting devices must be aligned on a specific line. For example, a blue semiconductor light emitting device must be aligned on any one of the three VDD electrodes 320a, 320b, 320b, and a red semiconductor light emission on the other 320b must be aligned on another one of the VDD electrodes 320a, 320b, 320b, and a green semiconductor light emitting device must be aligned on the remaining one of the VDD electrodes 320a, 320b, 320b. It can be difficult perform the self-assembly in a manner described in FIGS. 12 and 13.

The present disclosure provides a structure and method capable of not causing damage to TFTs during self-assembly, and selectively self-assembling semiconductor light emitting devices of the same color for each line.

Figure 15:
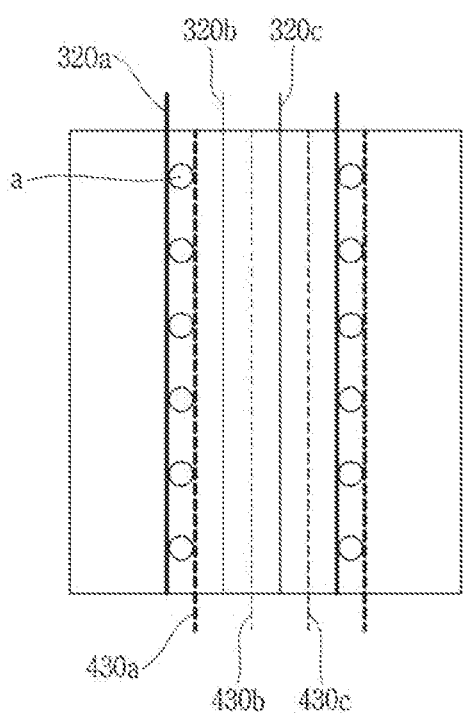
FIG. 15 is a conceptual view illustrating only a VDD electrode and a VData electrode provided in a display device according to the present disclosure.

FIG. 15 is a conceptual view illustrating only a VDD electrode and a VData electrode provided in a display device according to the present disclosure.

The present disclosure provides a structure and method capable of allowing the VDD electrode and the VData electrode arranged side by side to be used for self-assembly. Referring to FIG. 15, when a voltage is applied to any one 430a of three VDD electrodes 320a, 320b, 320b and three VSS electrodes 430a, 430b, 430c while the three VDD electrodes 320a, 320b, 320b and the three VSS electrodes 430a, 430b, 430c are disposed, the semiconductor light emitting devices are aligned in line along the VDD electrode and the VData electrode. When the structure and method is used, it can be possible to perform selective self-assembly for each line.

Prior to describing a display device according to the present disclosure, a problem occurring when self-assembly is performed with the VDD electrode and the VData electrode in the structure described with reference to FIGS. 10 and 11 will be described.

Figure 16:
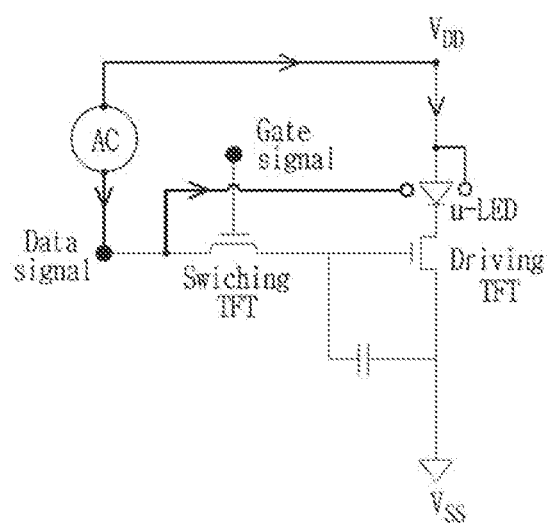
FIG. 16 is a circuit diagram capable of performing self-assembly using a VDD electrode and a VData electrode.
Figure 17:
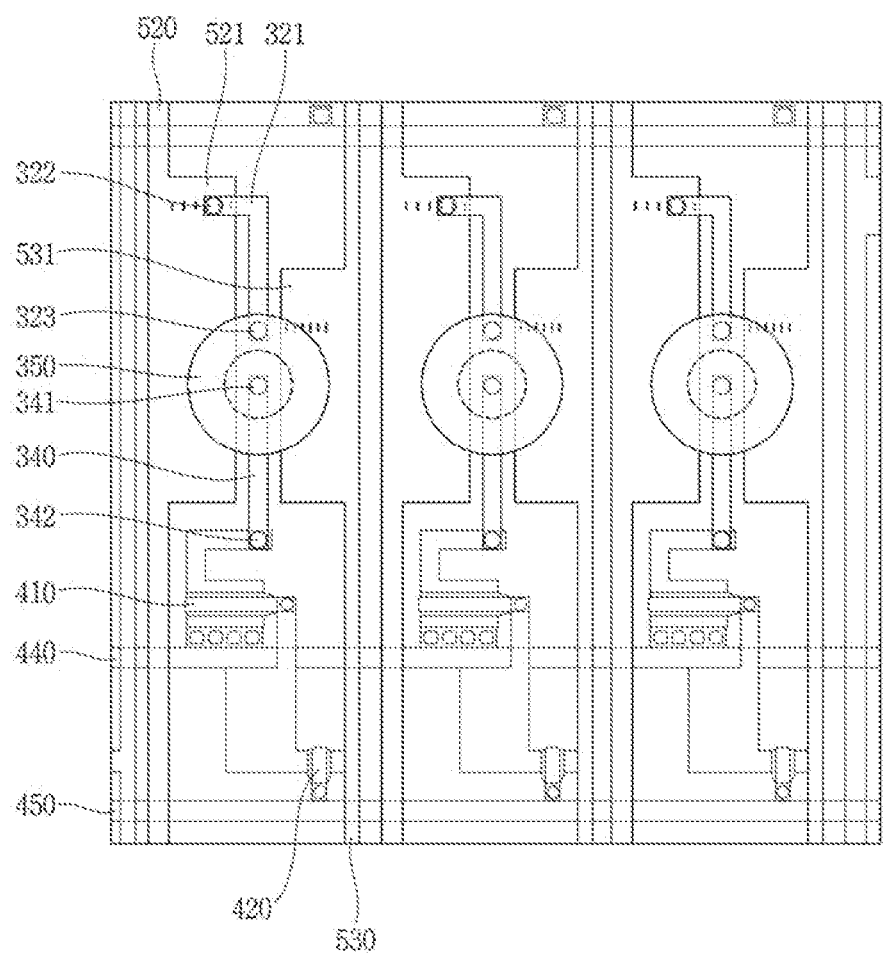
FIG. 17 is a plan view of a display device according to the circuit diagram described in FIG. 16.

FIG. 16 is a circuit diagram capable of performing self-assembly using a VDD electrode and a VData electrode, and FIG. 17 is a plan view of a display device according to the circuit diagram described in FIG. 16.

Referring to FIG. 16, an AC voltage applied during self-assembly is applied through the VDD and VData electrodes. At this time, the voltage applied through the VData electrode is applied to either one of the source electrode or the drain electrode of the second TFT. Meanwhile, no component is connected to the VDD electrode prior to self-assembly.

As shown in FIG. 17, a VDD electrode 520 and VData 530 disposed at positions adjacent to a region where the semiconductor light emitting device must be seated can be formed to be wider than the electrodes formed in other regions. To this end, each of the VDD electrode 520 and the VData 530 can include protruding portions 521, 531 protruding to overlap with a groove formed in the partition wall. Accordingly, a distance between the VDD electrode 520 and the VData 530 is reduced to strongly generate an electric field in the relevant region.

During self-assembly, the semiconductor light emitting device is seated between the VDD electrode 520 and the VData electrode 530. Then, as described in FIG. 11, the planarizing layer is formed, and then the semiconductor light emitting device is electrically connected to the VDD electrode 520' and the first TFT 410 through the connection electrodes 321, 322, 323, 340, 341, 342.

In case of the self-assembly method described with reference to FIGS. 16 and 17, as a strong voltage is applied to the second TFT 420 during self-assembly, there can occur a problem that the second TFT 420 is damaged. Accordingly, the magnitude of the AC voltage that can be applied during self-assembly is limited to a voltage at which the second TFT 420 is not damaged. For this reason, the intensity of an electric field formed between the VDD voltage 520 and the VData electrode 530 cannot be increased above a predetermined level.

The present disclosure allows self-assembly to be carried out while the VData electrode and the second TFT are not electrically connected.

Figure 18:
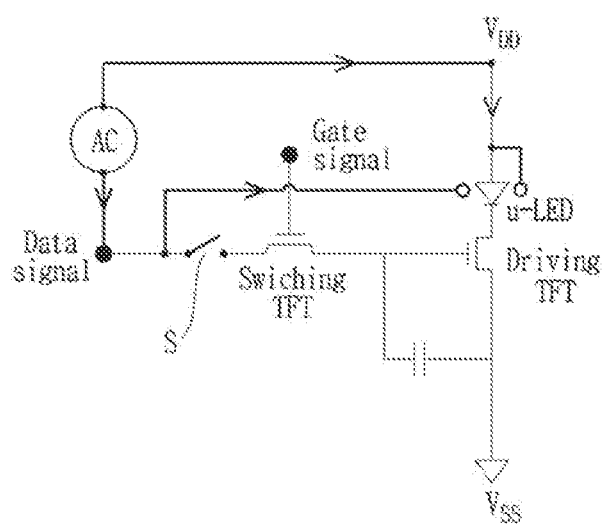
FIG. 18 is a circuit diagram of a display device according to the present disclosure.
Figure 19A:
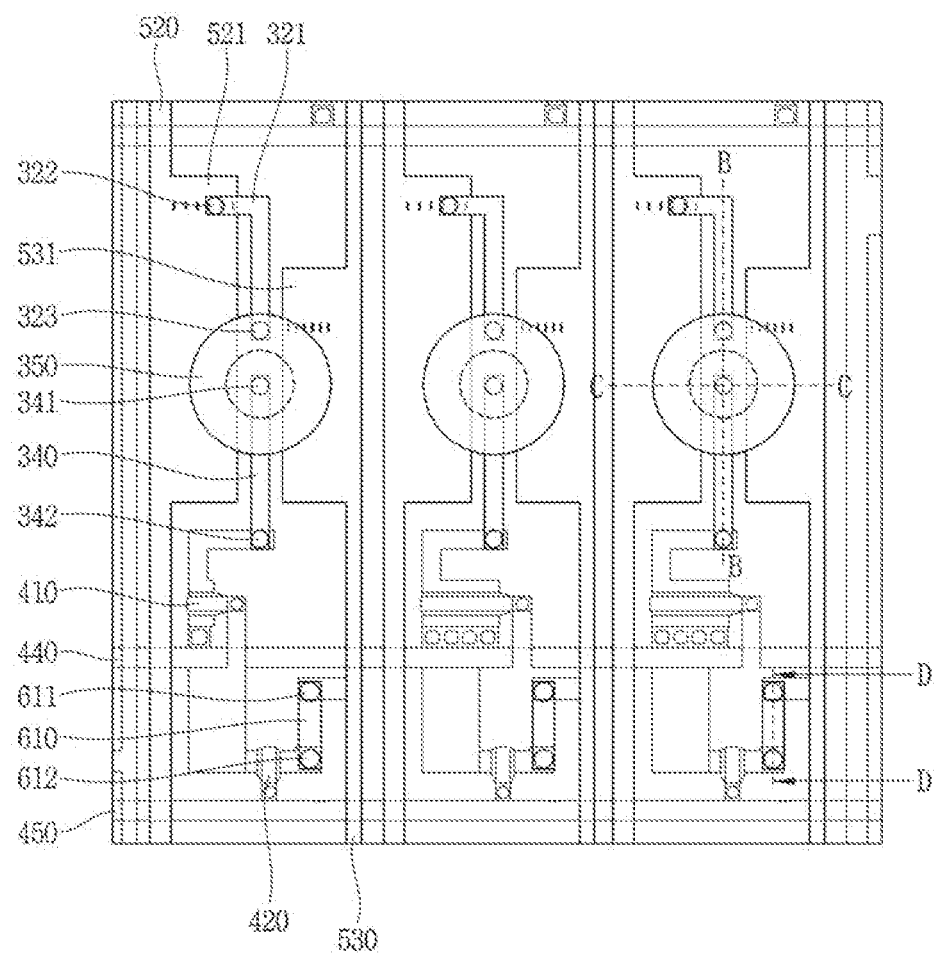
FIG. 19A is a plan view of a display device according to the circuit diagram described in FIG. 17.
Figure 19B:
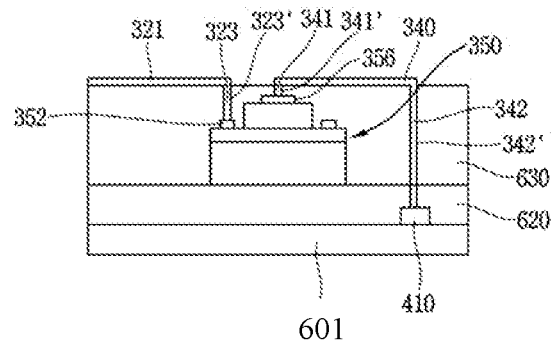
FIG. 19B is a cross-sectional view taken along line B-B in FIG. 19A.
Figure 19C:
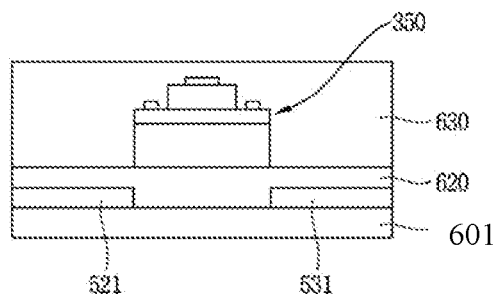
FIG. 19C is a cross-sectional view taken along line C-C in FIG. 19A.
Figure 19D:
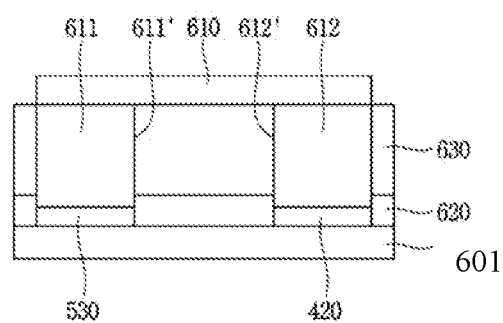
FIG. 19D is a cross-sectional view taken along line D-D in FIG. 19A.

FIG. 18 is a circuit diagram of a display device according to the present disclosure, and FIG. 19A is a plan view of a display device according to the circuit diagram described in FIG. 17, and FIG. 19B is a cross-sectional view taken along line B-B in FIG. 19A, and FIG. 19C is a cross-sectional view taken along line C-C in FIG. 19A, and FIG. 19D is a cross-sectional view taken along line D-D in FIG. 19A.

Referring to FIG. 18, the present disclosure applies voltages to the VDD and VData electrodes when the VData electrode and the second TFT are not electrically connected. At this time, no component is connected to each of the VDD and VData electrodes prior to self-assembly. The VData electrode and the second TFT are electrically connected through a wiring process subsequent to self-assembly.

Referring to FIG. 19A, an AC voltage is applied to the VDD electrode 320' and the drain electrode 400 of the first TFT 410 during self-assembly. A VDD electrode 520 and VData 530 disposed at positions adjacent to a region where the semiconductor light emitting device must be seated can be formed to be wider than the electrodes formed in other regions. To this end, each of the VDD electrode 520 and the VData 530 can include protruding portions 521, 531 protruding to overlap with a groove formed in the partition wall. The protruding portions 521, 531 can protrude toward a groove formed in the partition wall. Accordingly, a distance between the VDD electrode 520 and the VData 530 is reduced to strongly generate an electric field in the relevant region.

During self-assembly, the semiconductor light emitting device is seated between the VDD electrode 520 and the VData electrode 530. Then, as described in FIG. 11, the planarizing layer is formed, and then the semiconductor light emitting device is electrically connected to the VDD electrode 520' and the first TFT 410 through the connection electrodes 321, 322, 323, 340, 341, 342.

Meanwhile, during self-assembly, the VData electrode 530 and the second TFT 420 are not electrically connected. The planarizing layer is formed, and then the VData electrode 530 and the second TFT 420 are electrically connected through the connection electrodes 610, 611, 612.

Referring to FIG. 19B, the first TFT 410 is disposed on the base portion 601. A dielectric layer 620 disposed to cover the first TFT 410 is disposed on the portion 601. A partition wall is disposed on the dielectric layer 620 prior to self-assembly, and when the partition wall and the planarizing layer are formed of the same material, the partition wall and the planarizing layer may not be distinguished from each other. A planarizing layer 630 described below is configured to include the partition wall used during self-assembly.

Some of the connection electrodes 323, 341, 342 that electrically connect the semiconductor light emitting device 350, the VDD electrode 520, and the first TFT 410, respectively, are formed inside via holes 323', 341', 342' formed on the planarizing layer 630. Some of the via holes 323', 341', and 342' are formed to pass through the dielectric layer 620. Through this, some of the connection electrodes 342 can be electrically connected to the first TFT. Some of the connection electrodes 323, 341 are electrically connected to the first and second conductive electrodes 352, 356 formed in the semiconductor light emitting device 350.

On the other hand, referring to FIG. 19C, a semiconductor light emitting device is disposed between the VDD electrode (including the protruding portion 521 formed on the VDD electrode) and the VData electrode (including the protrusion 531 formed on a VDate electrode) used as an assembly electrode. Also, the protruding portions 521, 531 can be disposed to overlap with the semiconductor light emitting device.

A dielectric layer 620 is formed to cover the VDD electrode (including the protruding portion 521 formed on the VDD electrode) and the VData electrode (including the protruding portion 531 formed on the VDate electrode). During the self-assembly of the dielectric layer 620, the VDD electrode 520 and the VData electrode 530 are prevented from being oxidized in contact with a fluid. Meanwhile, the dielectric layer 620 is disposed between each of the VDD electrode 520 and the VData electrode 530 and the semiconductor light emitting device 350. Through this, the semiconductor light emitting device 350 is prevented from being electrically connected to the VDD electrode 520 and the VData electrode 530 during self-assembly.

On the other hand, referring to FIG. 19D, the second TFT 420 and the VData electrode 530 are electrically connected by connection electrodes 610, 611, 612.

The planarizing layer 630 includes a plurality of via holes 611', 612'. The plurality of via holes 611', 612' are formed to pass through the partition wall. Some of the connection electrodes 611, 612 are disposed inside each of the plurality of via holes 611', 612'.

The plurality of via holes 611' and 612' can include a first via hole 612' formed to overlap with the second TFT 420 and a second via hole 611' formed to overlap with the VData electrode 530.

Meanwhile, the connection electrodes 610, 611, 612 can include a first connection electrode 612 disposed in the first via hole 612', and a second connection electrode 611 disposed in the second via hole 611', and a third connection electrode 610 electrically connecting the first and second connection electrodes 611, 612. Here, the second TFT 420 and the VData electrode 530 are disposed on one surface of the planarizing layer 630, and the third connection electrode 610 is disposed on the other surface of the planarizing layer 630. When described with respect to the partition wall, the second TFT 420 and the VData electrode 530 are disposed on one surface of the partition wall, and the third connection electrode 610 is disposed on the other surface of the partition wall.

On the other hand, the first and second via holes 611', 612' are formed to pass through the dielectric layer 620. Accordingly, the first and second connection electrodes 611, 612 are also formed to pass through the dielectric layer 620, and electrically connected to each of the second TFT 420 and the VData electrode 530.

As described above, the second TFT 420 and the VData electrode 530 are electrically connected by the connection electrodes subsequent to self-assembly. Therefore, the TFT is not electrically connected to the VData electrode 530 during self-assembly. As a result, even though a high voltage is applied to the VData electrode 530 during self-assembly, there is no concern that the TFT is damaged. Through this, the present disclosure can perform self-assembly without having an additional assembly electrode.

Hereinafter, a method of performing self-assembly using the foregoing VDD electrode 520 and VData electrode 530 will be described.

Figure 20:
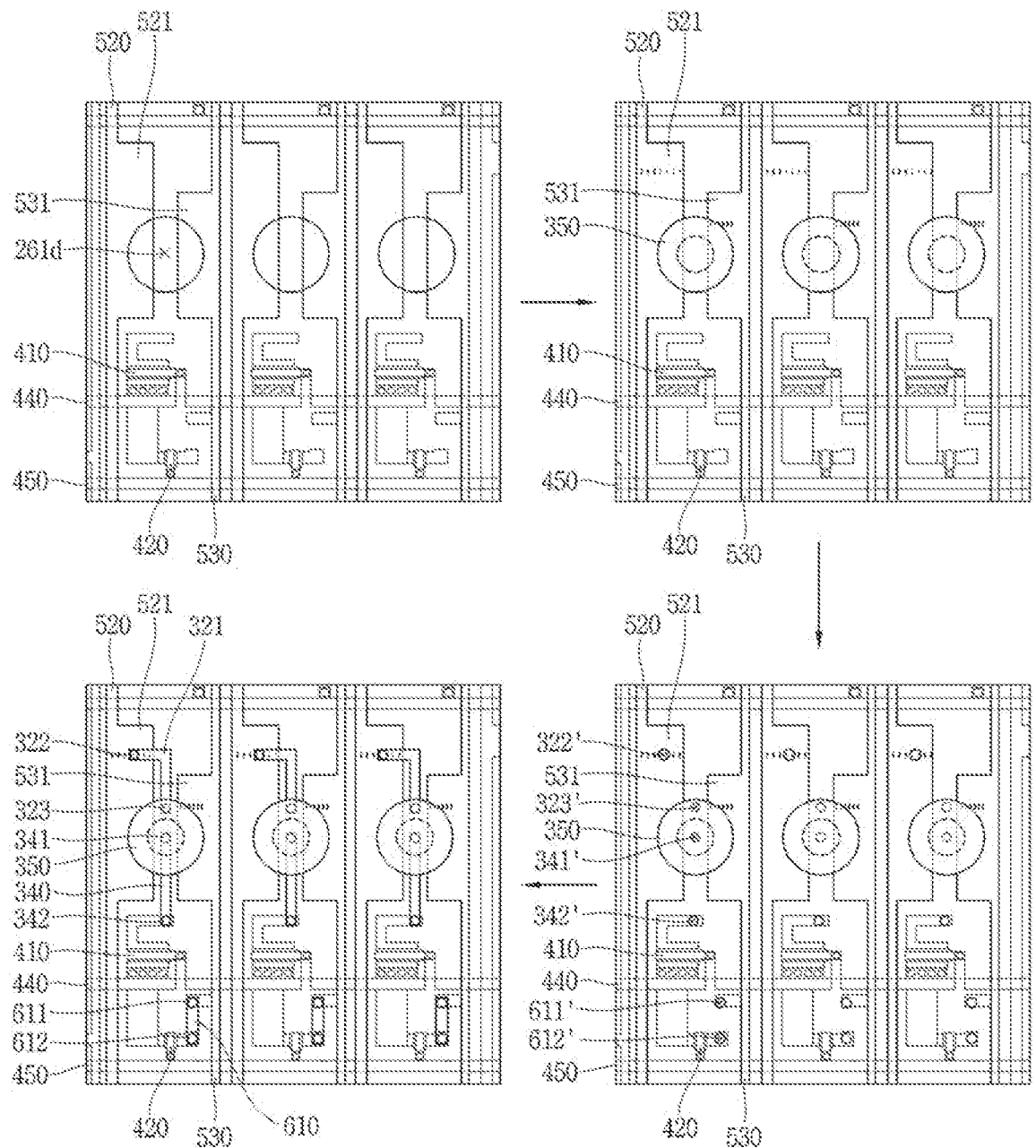
FIG. 20 is a conceptual view showing a state in which self-assembly is performed using a substrate according to the present disclosure.

FIG. 20 is a conceptual view showing a state in which self-assembly is performed using a substrate according to the present disclosure.

Referring to the first drawing of FIG. 20, grooves 261d are formed on the assembly substrate, and protruding portions 521, 531 formed on the VDD electrode 520 and the VData electrode 530, respectively, are disposed to overlap with the groove 261d. At this time, the second TFT 420 and the VData electrode 530 are not electrically connected.

Using a substrate shown in the first drawing of FIG. 20, self-assembly performed in FIGS. 8A to 8E is carried out. Accordingly, the semiconductor light emitting devices 350 are seated inside the grooves 261d.

A planarizing layer can be formed to cover the semiconductor light emitting device and the substrate while the semiconductor light emitting device 350 is seated at a preset position. Then, a process of forming a plurality of via holes on the planarizing layer is performed (refer to the third drawing in FIG. 20).

The process of forming the via holes can be performed through dry etching. At this time, a position where the via hole is formed can be controlled through a mask. At this time, at least six via holes can be formed per sub-pixel. Specifically, the via holes are formed in a region 322' overlapping with the VDD electrode 520, a region 323' overlapping with the first conductive electrode of the semiconductor light emitting device 350, a region 341' overlapping with the second conductive electrode, a region 342' overlapping with the drain electrode of the first TFT 410, a region 611' overlapping with the VData electrode 530, and a region 612' overlapping with the drain electrode or source electrode of the second TFT 420.

In the method of manufacturing the display device described in FIG. 11, four via holes are formed per subpixel. In comparison, two via holes are additionally formed in the manufacturing method according to the present disclosure. Since an etching process in which four via holes are formed and an etching process in which six via holes are formed can be both performed through a single mask, a via hole formed in the region 612' overlapping with the drain electrode or source electrode of the second TFT 420 can be formed without adding any additional process.

Then, the connection electrodes 321, 322, 323, 340, 341, 342, 610, 611, 612 are formed to electrically connect the VDD electrode 520 and the semiconductor light emitting device 350, the first TFT 410 and the semiconductor light emitting device 350, and the VData electrode 530 and the second TFT 420.

As described above, according to the present disclosure, there is no need to form an additional assembly electrode, thereby simplifying a manufacturing method of the display device. Meanwhile, a process of connecting the data electrode 530 and the second TFT 420 subsequent to self-assembly can be performed together in a wiring process in the related art, and thus a new process need not be added even though the data electrode 530 and the second TFT 420 are not electrically connected during self-assembly.

What is claimed is:

1. A display device, comprising:
   a base portion;
   a plurality of transistors disposed on the base portion;
   a plurality of semiconductor light emitting devices disposed on the base portion;
   a plurality of wiring electrodes disposed on the base portion, and electrically connected to the plurality of transistors and the plurality of semiconductor light emitting devices;
   a planarization layer disposed on the base portion, and formed to cover the plurality of transistors; and
   a connection electrode connecting some transistors of the plurality of transistors and some wiring electrodes of the plurality of wiring electrodes,
   wherein the connection electrode is configured to pass through the planarization layer,
   wherein the plurality of wiring electrodes comprises a VDD electrode and a VData electrode that are coplanar and interposed between the planarization layer and the base portion, and
   wherein a distance separating the VDD electrode and the VData electrode is less than a width of the plurality of semiconductor light emitting devices.

2. The display device of claim 1, wherein each of the some transistors and the some wiring electrodes is disposed on one surface of the planarization layer facing the base portion and located between opposite surfaces of the planarization layer.

3. The display device of claim 2, wherein a part of the connection electrode is disposed on another surface of the planarization layer, and located between the opposite surfaces of the planarization layer.

4. The display device of claim 3, wherein the one surface and the another surface are separated in a depth direction of the planarization layer, and the opposite surfaces are separated in a width direction of the planarization layer.

5. The display device of claim 3, wherein the planarization layer comprises a plurality of via holes formed to pass through the planarization layer, and wherein the part of the connection electrode is disposed inside the via hole.

6. The display device of claim 5, wherein the via hole comprises:
a first via hole formed to overlap with the some transistors; and
a second via hole formed to overlap with the some wiring electrodes.

7. The display device of claim 6, wherein the connection electrode comprises:
a first connection electrode disposed inside the first via hole;
a second connection electrode disposed inside the second via hole; and
a third connection electrode disposed on the another surface of the planarization layer to electrically connect the first and second connection electrodes.

8. The display device of claim 1, wherein the planarization layer comprises a plurality of grooves formed to pass through the planarization layer, and
wherein the plurality of semiconductor light emitting devices are disposed inside the plurality of grooves.

9. The display device of claim 8, wherein the some wiring electrodes comprise a protruding portion formed to protrude toward the plurality of grooves.

10. The display device of claim 9, wherein the plurality of semiconductor light emitting devices are disposed to overlap with the protruding portion.

11. The display device of claim 10, further comprising:
a dielectric layer formed between the some wiring electrodes and the plurality of semiconductor light emitting devices to maintain an insulation state between the some wiring electrodes and the plurality of semiconductor light emitting devices.

12. The display device of claim 11, wherein the connection electrode is formed to pass through the planarization layer and the dielectric layer.

13. The display device of claim 8, wherein another wiring electrode disposed in parallel to the some wiring electrodes comprises a protruding portion formed to protrude toward the plurality of grooves.

14. The display device of claim 9, wherein the protruding portion of one of the some wiring electrodes is wider than another portion of the one of the some wiring electrodes.

15. The display device of claim 8, wherein the plurality of grooves extend parallel to a surface of the base portion.

16. The display device of claim 1, wherein the VDD electrode and the VData electrode comprise a first protruding portion and a second protruding portion formed to protrude into a groove, respectively.

17. The display device of claim 16, wherein a semiconductor light emitting device from among the plurality of semiconductor light emitting device is disposed to overlap with both the first protruding portion and the second protruding portion.

18. A display device, comprising:
a base portion having a planar configuration;
a plurality of transistors disposed on the base portion;
a plurality of semiconductor light emitting devices disposed on the base portion;
a plurality of wiring electrodes disposed on the base portion, electrically connected to the plurality of transistors and the plurality of semiconductor light emitting devices, and including at least Vdd electrodes and Vdata electrodes,
wherein each of Vdd electrodes and Vdata electrodes includes a protruding portion that extends parallel to the base portion at a location of the plurality of semiconductor light emitting devices,
wherein a distance separating an adjacent pair of a Vdd electrode and a Vdata electrode from among the Vdd electrodes and the Vdata electrodes is less than a width of the plurality of semiconductor light emitting devices, and
wherein the adjacent pair of the Vdd electrode and the Vdata electrode are coplanar and interposed between a planarization layer and the base portion.

19. The display device of claim 18, further comprising:
a connection electrode connecting some transistors of the plurality of transistors and some wiring electrodes of the plurality of wiring electrodes; and
a planarization layer disposed on the base portion, and formed to cover the plurality of transistors,
wherein the connection electrode is configured to pass through the planarization layer.

20. A display device, comprising:
a base portion;
a plurality of transistors disposed on the base portion;
a plurality of semiconductor light emitting devices disposed on the base portion;
a plurality of wiring electrodes disposed on the base portion, and electrically connected to the plurality of transistors and the plurality of semiconductor light emitting devices;
a planarization layer disposed on the base portion, and formed to cover the plurality of transistors; and
a connection electrode connecting some transistors of the plurality of transistors and some wiring electrodes of the plurality of wiring electrodes,
wherein the connection electrode is configured to pass through the planarization layer,
wherein the planarization layer comprises a plurality of grooves formed to pass through the planarization layer,
wherein the plurality of semiconductor light emitting devices are disposed inside the plurality of grooves,
wherein the some wiring electrodes comprise a protruding portion formed to protrude toward the plurality of grooves, and
wherein the plurality of semiconductor light emitting devices are disposed to vertically overlap with the protruding portion.

* * * * *